United States Patent
Hatakeyama et al.

(10) Patent No.: US 6,730,451 B2
(45) Date of Patent: *May 4, 2004

(54) POLYMERS, CHEMICAL AMPLIFICATION RESIST COMPOSITIONS AND PATTERNING PROCESS

(75) Inventors: Jun Hatakeyama, Nakakubiki-gun (JP); Jun Watanabe, Nakakubiki-gun (JP); Yuji Harada, Nakakubiki-gun (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/735,521

(22) Filed: Dec. 14, 2000

(65) Prior Publication Data

US 2001/0010890 A1 Aug. 2, 2001

(30) Foreign Application Priority Data

Dec. 15, 1999 (JP) .............................. 11-356220

(51) Int. Cl.$^7$ .............................. G03F 7/038; G03F 7/40; G03F 7/38
(52) U.S. Cl. .................... 430/270.1; 430/296; 430/330; 430/326; 430/905; 430/907; 430/910; 525/276; 528/271; 526/242; 526/245
(58) Field of Search .................. 430/270.1, 296, 430/330, 326; 525/276; 528/271; 526/242, 245

(56) References Cited

U.S. PATENT DOCUMENTS

| | | | | |
|---|---|---|---|---|
| 4,613,657 A | * | 9/1986 | Narita et al. ................ | 526/204 |
| 4,615,584 A | * | 10/1986 | Ohmori et al. ............. | 350/96.34 |
| 4,644,043 A | * | 2/1987 | Ohmori et al. ............. | 526/246 |
| 4,665,144 A | * | 5/1987 | Ohmori et al. ............. | 526/245 |
| 4,666,991 A | * | 5/1987 | Matsui et al. ............... | 525/276 |
| 4,689,289 A | * | 8/1987 | Crivello .................... | 430/270.1 |
| 4,810,766 A | * | 3/1989 | Ohmori et al. ............. | 526/279 |
| 5,021,527 A | * | 6/1991 | Ohmori et al. ............. | 526/245 |
| 5,112,973 A | * | 5/1992 | Morita et al. ............... | 544/387 |
| 5,231,219 A | * | 7/1993 | Grison et al. ............... | 560/210 |
| 5,283,303 A | * | 2/1994 | Groh et al. .................. | 526/245 |
| 5,302,316 A | * | 4/1994 | Hashimoto et al. ...... | 252/183.11 |
| 5,550,004 A | * | 8/1996 | Honda ...................... | 430/270.1 |
| 5,861,231 A | * | 1/1999 | Barclay et al. ........... | 430/270.1 |
| 6,280,897 B1 | * | 8/2001 | Asakawa et al. ......... | 430/270.1 |
| 6,576,400 B1 | * | 6/2003 | Tamura ..................... | 430/296 |
| 2001/0018162 A1 | * | 8/2001 | Hatakeyama et al. .... | 430/270.1 |
| 2001/0033989 A1 | * | 10/2001 | Harada et al. ............. | 430/270.1 |
| 2001/0038969 A1 | * | 11/2001 | Hatakeyama et al. .... | 430/270.1 |
| 2002/0058198 A1 | * | 5/2002 | Klauck-Jacobs et al. . | 430/270.1 |
| 2002/0161148 A1 | * | 10/2002 | Harada et al. ............. | 526/242 |

FOREIGN PATENT DOCUMENTS

| JP | 59021648 A | * | 2/1984 | ......... C07C/69/653 |
|---|---|---|---|---|
| JP | 60252348 A | * | 12/1985 | ............ G03C/1/72 |

* cited by examiner

*Primary Examiner*—Mark F. Huff
*Assistant Examiner*—Yvette C. Thornton
(74) *Attorney, Agent, or Firm*—Millen, White, Zelano & Branigan, P.C.

(57) ABSTRACT

Polymers comprising recurring units of an acrylic derivative of fluorinated backbone represented by formula (1) are novel.

(1)

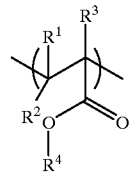

$R^1$, $R^2$ and $R^3$ are independently H, F, $C_{1-20}$ alkyl or fluorinated $C_{1-20}$ alkyl, at least one of $R^1$, $R^2$ and $R^3$ contains fluorine, and $R^4$ is an acid labile group. Using such polymers, resist compositions featuring low absorption of $F_2$ excimer laser light are obtained.

30 Claims, No Drawings

POLYMERS, CHEMICAL AMPLIFICATION RESIST COMPOSITIONS AND PATTERNING PROCESS

This invention relates to polymers useful as the base polymer in resist compositions, especially chemical amplification resist compositions suited for microfabrication. It also relates to chemical amplification resist compositions comprising the polymers, and a patterning process using the same.

BACKGROUND OF THE INVENTION

In the drive for higher integration and operating speeds in LSI devices, the pattern rule is made drastically finer. The rapid advance toward finer pattern rules is grounded on the development of a projection lens with an increased NA, a resist material with improved performance, and exposure light of a shorter wavelength. In particular, the change-over from i-line (365 nm) to shorter wavelength KrF laser (248 nm) brought about a significant innovation, enabling mass-scale production of 0.18 micron rule devices. To the demand for a resist material with a higher resolution and sensitivity, acid-catalyzed chemical amplification positive working resist materials are effective as disclosed in U.S. Pat. Nos. 4,491,628 and 5,310,619 (JP-B 2-27660 and JP-A 63-27829). They now become predominant resist materials especially adapted for deep UV lithography.

Resist materials adapted for KrF excimer lasers enjoyed early use on the 0.3 micron process, went through the 0.25 micron rule, and currently entered the mass production phase on the 0.18 micron rule. Engineers have started investigation on the 0.15 micron rule, with the trend toward a finer pattern rule being accelerated. A wavelength change-over from KrF to shorter wavelength ArF laser (193 nm) is expected to enable miniaturization of the design rule to 0.13 $\mu$m or less. Since conventionally used novolac resins and polyvinylphenol resins have very strong absorption in proximity to 193 nm, they cannot be used as the base resin for resists. To ensure transparency and dry etching resistance, some engineers investigated acrylic and alicyclic (typically cycloolefin) resins as disclosed in JP-A 9-73173, JP-A 10-10739, JP-A 9-230595 and WO 97/33198. With respect to $F_2$ excimer laser (157 nm) which is expected to enable further miniaturization to 0.10 $\mu$m or less, more difficulty arises in insuring transparency because it was found that acrylic resins are not transmissive to light at all and those cycloolefin resins having carbonyl bonds have strong absorption.

SUMMARY OF THE INVENTION

An object of the invention is to provide a novel polymer having a high transmittance to vacuum ultraviolet radiation of up to 300 nm, especially an $F_2$ excimer laser beam (157 nm), $Kr_2$ excimer laser beam (146 nm), KrAr excimer laser beam (134 nm) and $Ar_2$ excimer laser beam (126 nm), and useful as the base polymer in a resist composition. Another object is to provide a resist composition comprising the polymer, and a patterning process using the same.

The inventor has found that using a resin based on a polymer comprising as recurring units an acrylic derivative of a fluorinated backbone represented by the general formula (1) defined below, a resist composition featuring transparency and capable of preventing the negative working phenomenon is obtained.

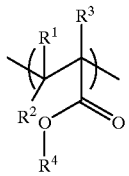

(1)

Herein $R^1$, $R^2$ and $R^3$ are independently hydrogen, fluorine or unsubstituted or fluorinated, straight, branched or cyclic alkyl groups of 1 to 20 carbon atoms, at least one of $R^1$, $R^2$ and $R^3$ contains fluorine; and $R^4$ is an acid labile group.

As long as the inventor has confirmed, polyvinyl phenol is somewhat improved in transmittance near 160 nm, but far below the practical level, and reducing carbonyl and carbon-to-carbon double bonds is essential for insuring a transmittance.

However, cyclic structures and carbon-to-carbon double bonds greatly contribute to an improvement in dry etching resistance. A polymer for use with an ArF excimer laser, in which a benzene ring is excluded and instead, an alicyclic structure is introduced for improving etching resistance, is difficult to provide transparency since it acquires solubility by relying on carboxylic acid. The inventor has found that use of a fluorine-substituted polymer is effective for improving transparency. Through studies on how to improve the transparency of acrylic polymers used in ArF resists, the inventor has arrived at the use of an acrylic derivative having a fluorine-substituted backbone.

What becomes a problem as a result of wavelength reduction is a lowering of transparency, and in the case of a positive resist material, a negative working phenomenon that the exposed areas become insoluble as the dose of exposure is increased. Those portions which have turned negative are insoluble not only in alkali developers, but also in organic solvents such as acetone. This indicates that gel forms as a result of crosslinking of molecules together. Radical generation is probably one cause of crosslinking. As a result of wavelength reduction, the exposure energy is increased so that even C—C bonds and C—H bonds may be excited in the case of $F_2$ exposure (157 nm). As a result of excitation, radicals are generated with a possibility that molecules are bonded together. For polymers having an alicyclic structure for use in ArF exposure, for example, polynorbornene, an outstanding negative working phenomenon was observed. It is believed that these polymers have a structure susceptible to crosslinking since the alicyclic group has many C—H bonds at the bridgehead. On the other hand, it is well known that α-methylstyrene and derivatives thereof are effective for preventing crosslinking. Alpha-methylstyrene can mitigate the negative working phenomenon, but fail to completely eliminate the phenomenon. Moreover, since oxygen absorption is considerable in the VUV region, exposure is effected under the conditions that oxygen is purged, with an inert gas such as nitrogen or argon, to an oxygen concentration of 1 ppm or lower. Since oxygen is an effective radical trapping agent, this means that the radicals generated have a long lifetime and more crosslinking takes place. As a result of the ensuing studies, an outstanding negative working phenomenon was observed for a resist composition comprising a polyhydroxystyrene base polymer among many other types of resist polymers, but rarely for a resist composition based on acrylate. This indicates that using a polyacrylate having a fluorinated backbone, a resist composition featuring transparency and capable of preventing negative working phenomenon is obtainable.

In a first aspect, the invention provides a polymer comprising recurring units of an acrylic derivative of fluorinated backbone represented by the above general formula (1).

In another aspect, the invention provides a photoresist composition comprising the polymer defined above. One embodiment of the invention is a chemical amplification, positive resist composition comprising (A) the polymer defined above, (B) an organic solvent, and (C) a photoacid generator. In preferred embodiments, the resist composition further includes a basic compound and/or a dissolution inhibitor.

In a further aspect, the invention provides a process for forming a pattern, comprising the steps of (1) applying the resist composition defined above onto a substrate to form a coating; (2) heat treating the coating and exposing the coating to high energy radiation with a wavelength of up to 300 nm or electron beam through a photo-mask; (3) optionally heat treating the exposed coating, and developing the coating with a developer.

DESCRIPTION OF THE PREFERRED EMBODIMENT

Polymer

According to the invention, the polymer or high molecular weight compound is defined as comprising recurring units of an acrylic derivative of fluorinated backbone represented by the following general formula (1).

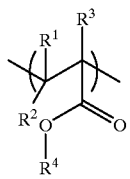

(1)

Herein $R^1$, $R^2$ and $R^3$ are independently hydrogen, fluorine or unsubstituted or fluorinated, straight, branched or cyclic alkyl groups of 1 to 20 carbon atoms, at least one of $R^1$, $R^2$ and $R^3$ contains fluorine; and $R^4$ is an acid labile group.

The straight, branched or cyclic alkyl groups represented by $R^1$, $R^2$ and $R^3$ are those of 1 to 20 carbon atoms, preferably 1 to 12 carbon atoms, and more preferably 1 to 10 carbon atoms, including methyl, ethyl, propyl, isopropyl, n-butyl, sec-butyl, tert-butyl, cyclopentyl, cyclohexyl, 2-ethylhexyl, and n-octyl. The fluorinated alkyl groups correspond to the foregoing alkyl groups in which some or all of the hydrogen atoms are replaced by fluorine atoms and include, for example, trifluoromethyl, 2,2,2-trifluoroethyl, 3,3,3-trifluoropropyl, and 1,1,2,2,3,3,3-heptafluoropropyl.

The acid labile group represented by $R^4$ is selected from a variety of such groups, preferably from among the groups of the following formulas (2) and (3), tertiary alkyl groups with 4 to 40 carbon atoms of the following formula (4), trialkylsilyl groups whose alkyl groups each have 1 to 6 carbon atoms, and oxoalkyl groups of 4 to 20 carbon atoms.

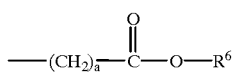

(2)

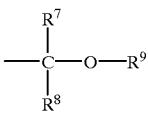

(3)

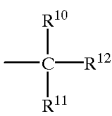

(4)

In formula (2), $R^6$ is a tertiary alkyl group of 4 to 20 carbon atoms, preferably 4 to 15 carbon atoms, a trialkylsilyl group whose alkyl groups each have 1 to 6 carbon atoms, an oxoalkyl group of 4 to 20 carbon atoms or a group of formula (4). Exemplary tertiary alkyl groups are tert-butyl, tert-amyl, 1,1-diethylpropyl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, and 2-methyl-2-adamantyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxoran-5-yl. Letter "a" is an integer of 0 to 6.

In formula (3), $R^7$ and $R^8$ are independently hydrogen or straight, branched or cyclic alkyl groups of 1 to 18 carbon atoms, preferably 1 to 10 carbon atoms, for example, methyl, ethyl, propyl, isopropyl, n-butyl, sec-butyl, tert-butyl, cyclopentyl, cyclohexyl, 2-ethylhexyl and n-octyl. $R^9$ is a monovalent hydrocarbon group of 1 to 18 carbon atoms, preferably 1 to 10 carbon atoms, which may have a hetero atom (e.g., oxygen atom), for example, straight, branched or cyclic alkyl groups, and such groups in which some hydrogen atoms are replaced by hydroxyl, alkoxy, oxo, amino or alkylamino groups. Illustrative examples of the substituted alkyl groups are given below.

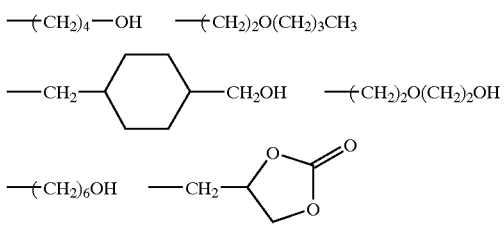

A pair of $R^7$ and $R^8$, a pair of $R^7$ and $R^9$, or a pair of $R^8$ and $R^9$, taken together, may form a ring. Each of $R^7$, $R^8$ and $R^9$ is a straight or branched alkylene group of 1 to 18 carbon atoms, preferably 1 to 10 carbon atoms, when they form a ring.

Illustrative examples of the acid labile groups of formula (2) include tert-butoxycarbonyl, tert-butoxycarbonylmethyl, tert-amyloxycarbonyl, tert-amyloxycarbonyl-methyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl.

Of the acid labile groups of formula (3), illustrative examples of the straight or branched groups are given below.

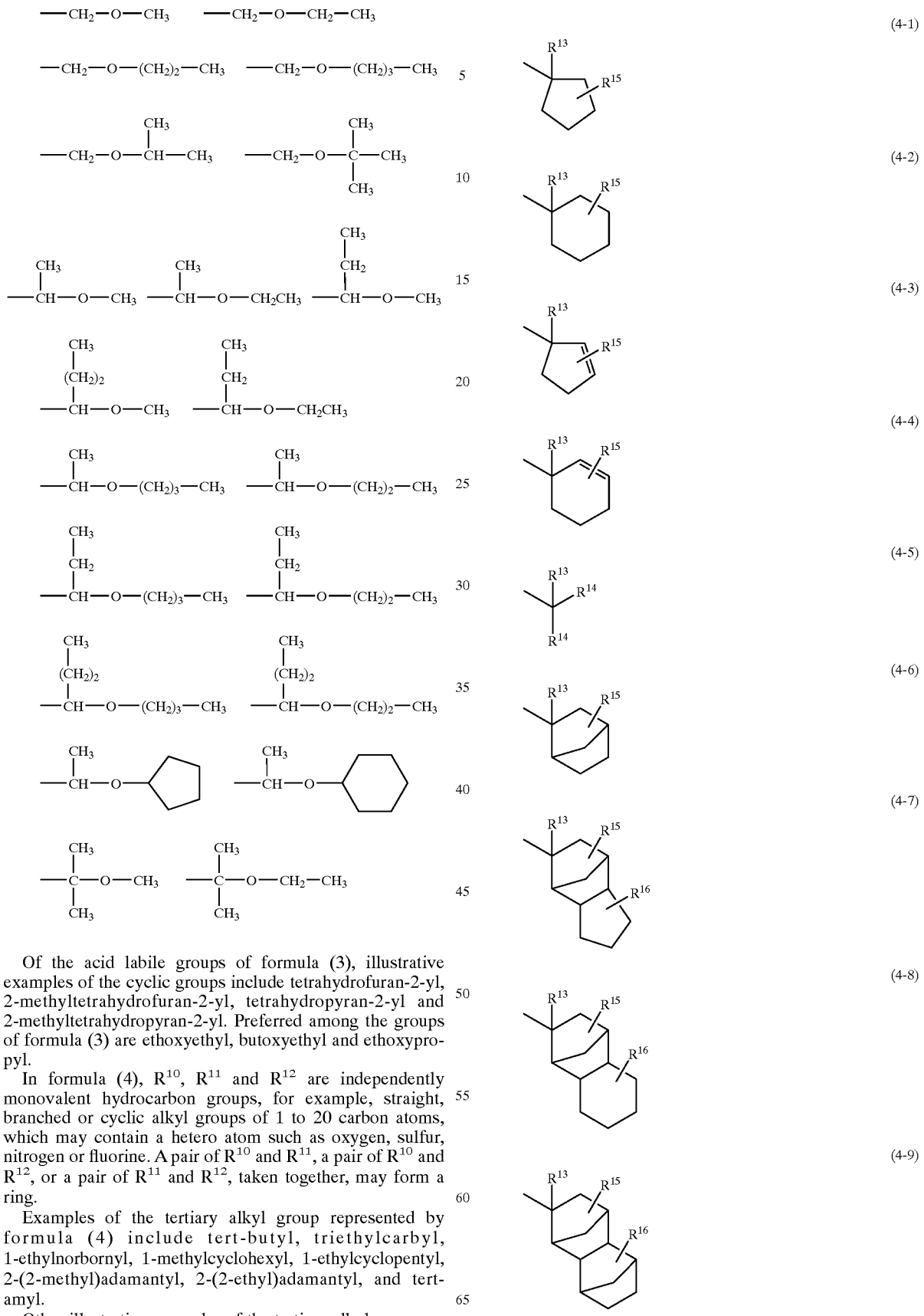

Of the acid labile groups of formula (3), illustrative examples of the cyclic groups include tetrahydrofuran-2-yl, 2-methyltetrahydrofuran-2-yl, tetrahydropyran-2-yl and 2-methyltetrahydropyran-2-yl. Preferred among the groups of formula (3) are ethoxyethyl, butoxyethyl and ethoxypropyl.

In formula (4), $R^{10}$, $R^{11}$ and $R^{12}$ are independently monovalent hydrocarbon groups, for example, straight, branched or cyclic alkyl groups of 1 to 20 carbon atoms, which may contain a hetero atom such as oxygen, sulfur, nitrogen or fluorine. A pair of $R^{10}$ and $R^{11}$, a pair of $R^{10}$ and $R^{12}$, or a pair of $R^{11}$ and $R^{12}$, taken together, may form a ring.

Examples of the tertiary alkyl group represented by formula (4) include tert-butyl, triethylcarbyl, 1-ethylnorbornyl, 1-methylcyclohexyl, 1-ethylcyclopentyl, 2-(2-methyl)adamantyl, 2-(2-ethyl)adamantyl, and tert-amyl.

Other illustrative examples of the tertiary alkyl group are given below as formulae (4-1) through (4-16).

-continued (4-10) 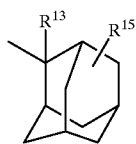

(4-11) 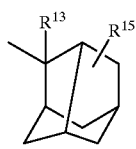

(4-12) 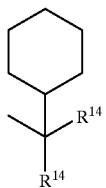

(4-13) 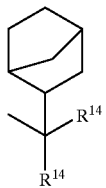

(4-14) 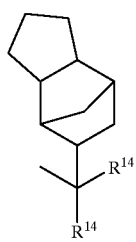

(4-15) 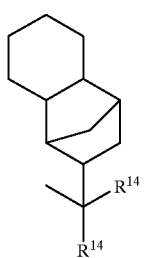

(4-16) 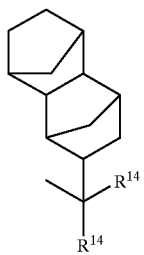

Herein, $R^{13}$ and $R^{14}$ are independently straight, branched or cyclic alkyl groups of 1 to 6 carbon atoms, for example, methyl, ethyl, propyl, isopropyl, n-butyl, sec-butyl, n-pentyl, n-hexyl, cyclopropyl and cyclopropylmethyl. $R^{15}$ is hydrogen or a monovalent hydrocarbon group of 1 to 6 carbon atoms which may contain a hetero atom or a monovalent hydrocarbon group of 1 to 6 carbon atoms, typically alkyl, which may be separated by a hetero atom. The hetero atom is an oxygen, sulfur or nitrogen atom, which is contained or intervenes in the form of —OH, —OR, —O—, —S—, —S(=O)—, —NH$_2$, —NHR, —NR$_2$, —NH—, or —NR— wherein R is an alkyl group of 1 to 20 carbon atoms, and especially 1 to 16 carbon atoms.

$R^{16}$ is hydrogen or an alkyl, hydroxyalkyl, alkoxy or alkoxyalkyl group of 1 to 20 carbon atoms, especially 1 to 16 carbon atoms, which may be straight, branched or cyclic. Illustrative examples include methyl, hydroxymethyl, ethyl, hydroxyethyl, propyl, isopropyl, n-butyl, sec-butyl, n-pentyl, n-hexyl, methoxy, methoxymethoxy, ethoxy, and tert-butoxy.

Of the acid labile group represented by $R^4$, the trialkylsilyl groups whose alkyl groups each have 1 to 6 carbon atoms include trimethylsilyl, triethylsilyl, and tert-butyldimethylsilyl.

The oxoalkyl groups of 4 to 20 carbon atoms include 3-oxocyclohexyl and groups of the following formulae.

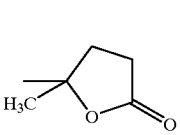 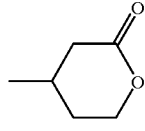

The polymer or fluorinated polyacrylate compound comprising recurring units of formula (1) according to the invention may be prepared using an acid-eliminatable substituent-containing monomer of the following formula (1a):

(1a)
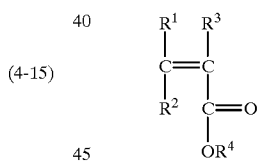

wherein $R^1$ to $R^4$ are as defined above.

Examples of the monomers include those of the following formulae (1a)-1 to (1a)-b.

(1a)-1
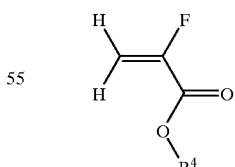

(1a)-2
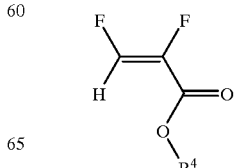

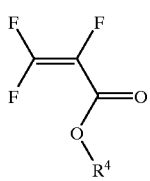
(1a)-3

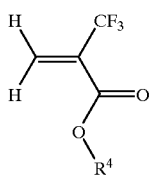
(1a)-4

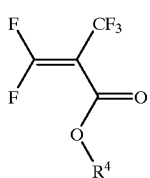
(1a)-5

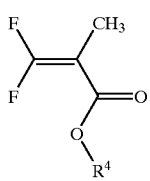
(1a)-6

In preparing the fluorinated polyacrylate compound, a monomer containing a substituent having an ability to promote adhesion or a monomer having an ability to improve dry etching resistance may be used in combination with the acid-eliminatable substituent-containing monomer. The adhesion promoting monomers are those containing hydrophilic substituents such as phenol, acid anhydride, ester (lactone), carbonate, alcohol, carboxylic acid, carboxylic amide, sulfonic amide, and ketone groups, for example, those monomers of the following formulas (5-1) through (5-41).

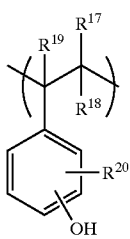
(5-1)

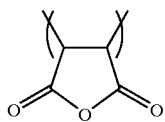
(5-2)

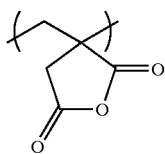
(5-3)

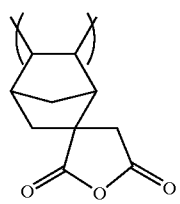
(5-4)

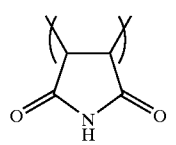
(5-5)

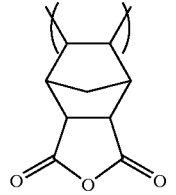
(5-6)

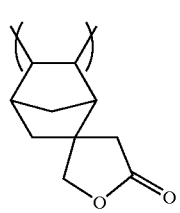
(5-7)

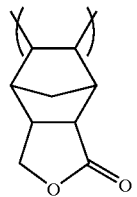
(5-8)

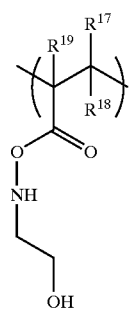
(5-9)

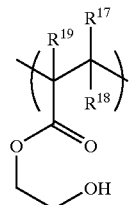
(5-10)

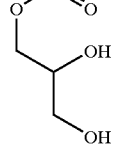

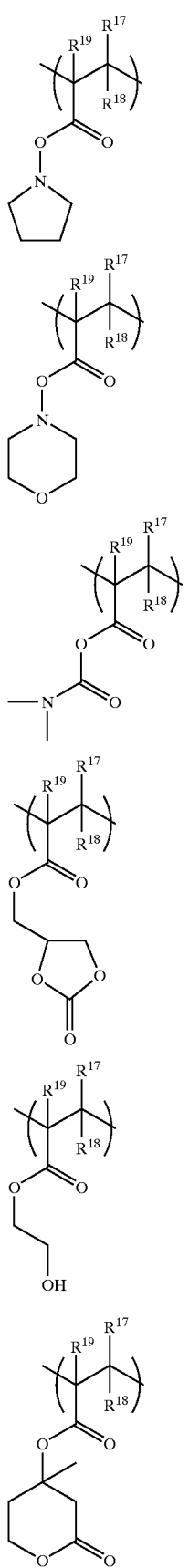
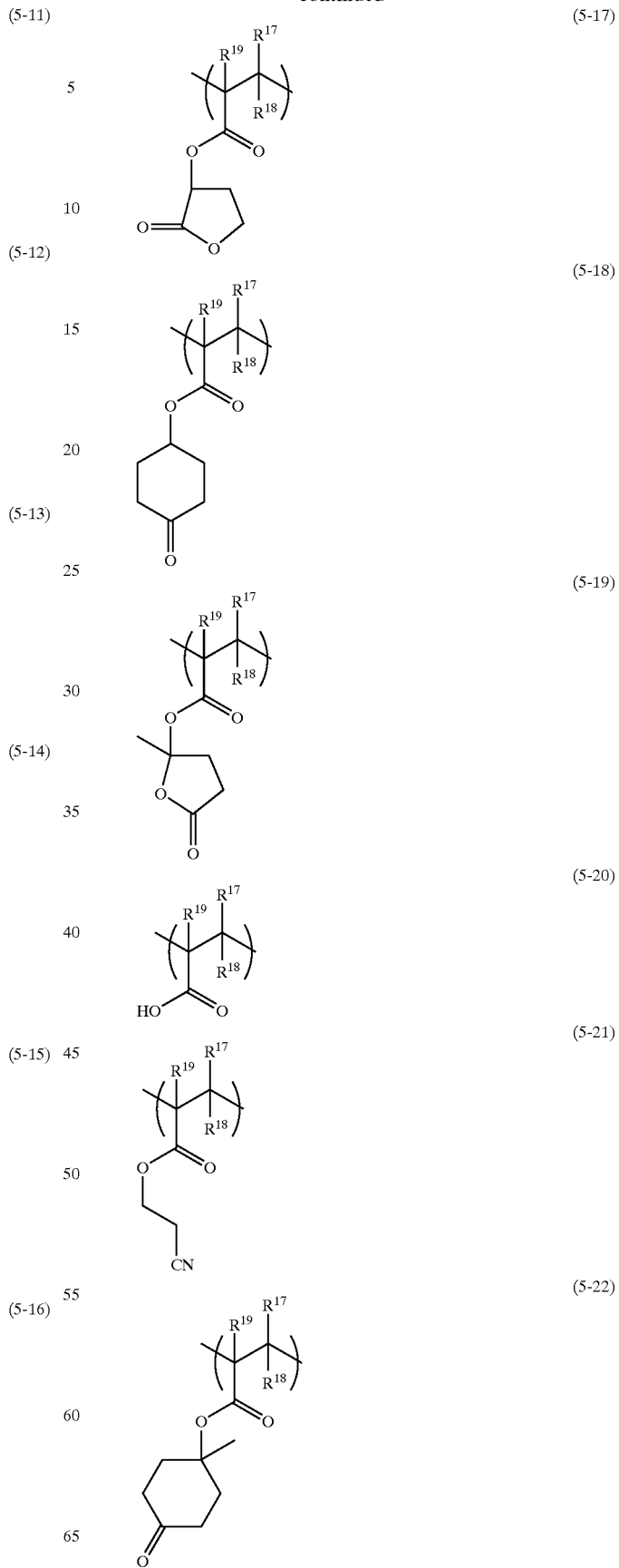

(5-23) 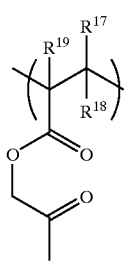
(5-24) 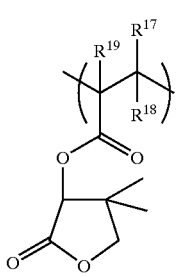
(5-25) 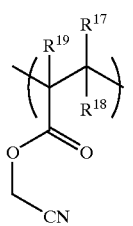
(5-26) 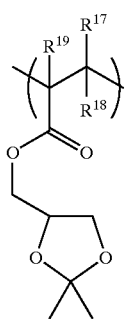
(5-27) 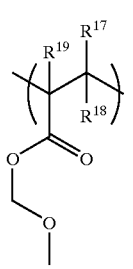
(5-28) 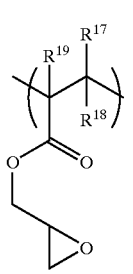
(5-29) 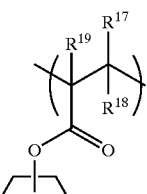
(5-30) 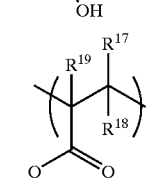
(5-31) 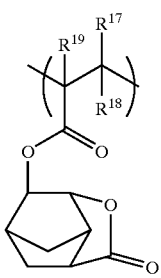
(5-32) 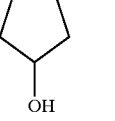
(5-33) 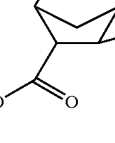

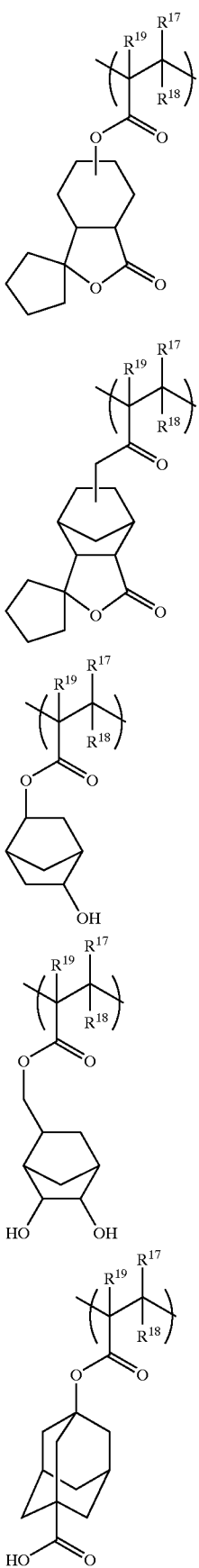
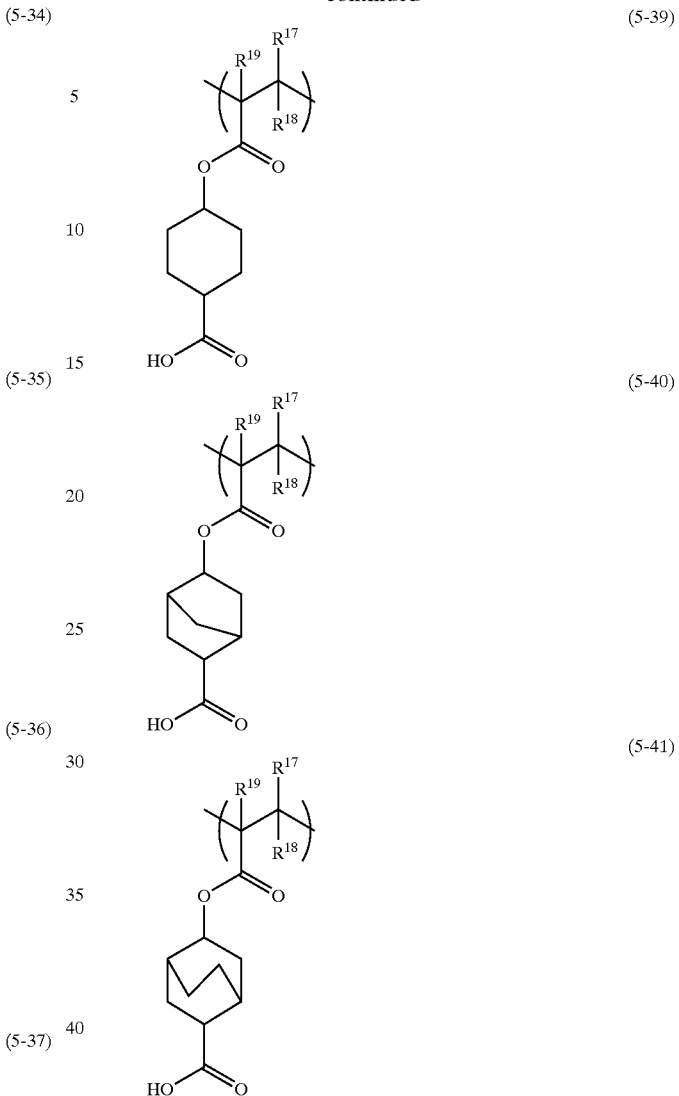

R[17], R[18], R[19] and R[20] are hydrogen, straight, branched or cyclic alkyl groups of 1 to 20 carbon atoms, with examples of the alkyl being the same as illustrated above.

The polymer or high molecular weight compound is generally prepared by mixing the above-mentioned monomer and optional monomer with a solvent, adding a catalyst thereto, and effecting polymerization reaction while heating or cooling the system if necessary. The polymerization reaction depends on the type of initiator or catalyst, trigger means (including light, heat, radiation and plasma), and polymerization conditions (including temperature, pressure, concentration, solvent, and additives). Commonly used for the polymerization of the monomer are radical polymerization of triggering polymerization with radicals of α,α'-azobisisobutyronitrile (AIBN) or the like, and ion (anion) polymerization using catalysts such as alkyl lithium. Such polymerization may be effected in a conventional manner.

The polymer of the invention preferably has a weight average molecular weight of about 1,000 to 1,000,000, and especially about 2,000 to 100,000.

The polymer of the invention is useful in resist compositions, and especially chemical amplification type resist compositions.

Resist Composition

A first embodiment of the invention is a photoresist composition comprising the polymer defined above.

A second embodiment of the invention is a chemical amplification positive resist composition comprising (A) the polymer defined above, (B) an organic solvent, and (C) a photoacid generator.

In preferred embodiments, the resist composition may further contain (D) a basic compound or (E) a dissolution inhibitor or both.

Component (B)

The organic solvent used as component (B) in the invention may be any organic solvent in which the photoacid generator, base resin (inventive polymer), dissolution inhibitor, and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate. These solvents may be used alone or in combinations of two or more thereof. Of the above organic solvents, preferred are diethylene glycol dimethyl ether, 1-ethoxy-2-propanol and ethyl lactate, in which the photoacid generator is most soluble, and propylene glycol monomethyl ether acetate which is safe, and mixtures thereof.

The organic solvent is typically used in an amount of about 200 to 5,000 parts, and especially about 400 to 3,000 parts by weight per 100 parts by weight of the base resin.

Component (C)

Suitable examples of the photoacid generator (C) include onium salts of general formula (6) below, diazomethane derivatives of formula (7), glyoxime derivatives of formula (8), β-ketosulfone derivatives, disulfone derivatives, nitrobenzylsulfonate derivatives, sulfonic acid ester derivatives, and imidoyl sulfonate derivatives.

$$(R^{30})_b M^+ K^- \tag{6}$$

In the formula, $R^{30}$ is a straight, branched or cyclic alkyl of 1 to 12 carbon atoms, an aryl of 6 to 12 carbon atoms, or an aralkyl of 7 to 12 carbon atoms; $M^+$ is iodonium or sulfonium; $K^-$ is a non-nucleophilic counter-ion; and the letter b is 2 or 3.

Illustrative examples of alkyl groups represented by $R^{30}$ include methyl, ethyl, propyl, butyl, cyclohexyl, 2-oxocyclohexyl, norbornyl, and adamantyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary aralkyl groups include benzyl and phenethyl. Examples of the non-nucleophilic counter-ion represented by $K^-$ include halide ions such as chloride and bromide; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; and alkylsulfonate ions such as mesylate and butanesulfonate.

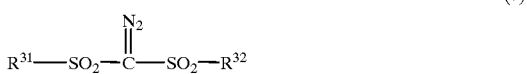

(7)

In the formula, $R^{31}$ and $R^{32}$ are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms.

Illustrative examples of alkyl groups represented by $R^{31}$ and $R^{32}$ include methyl, ethyl, propyl, butyl, amyl, cyclopentyl, cyclohexyl, norbornyl, and adamantyl. Exemplary halogenated alkyl groups include trifluoromethyl, 1,1,1-trifluoroethyl, 1,1,1-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorobenzene, chlorobenzene, and 1,2,3,4,5-pentafluorobenzene. Exemplary aralkyl groups include benzyl and phenethyl.

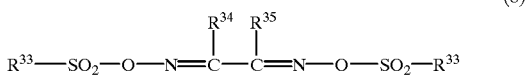

(8)

In the formula, $R^{33}$, $R^{34}$, and $R^{35}$ are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms. $R^{34}$ and $R^{35}$ may together form a cyclic structure with the proviso that if they form a cyclic structure, each is a straight or branched alkylene group of 1 to 6 carbon atoms.

The alkyl, halogenated alkyl, aryl, halogenated aryl, and aralkyl groups represented by $R^{33}$, $R^{34}$, and $R^{35}$ are exemplified by the same groups as mentioned above for $R^{31}$ and $R^{32}$. Examples of alkylene groups represented by $R^{34}$ and $R^{35}$ include methylene, ethylene, propylene, butylene, and hexylene.

Illustrative examples of the photoacid generator include:
onium salts such as diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)-sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2- oxocyclohexyl) sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, and dicyclohexylphenylsulfonium p-toluenesulfonate;

diazomethane derivatives such as bis(benzenesulfonyl) diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl) diazomethane, bis(isopropylsulfonyl)diazomethane, bis(tert-butylsulfonyl)diazomethane, bis(n-amylsulfonyl) diazomethane, bis(isoamylsulfonyl) diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-1-(tert-butylsulfonyl)diazomethane;

glyoxime derivatives such as bis-o-(p-toluenesulfonyl)-α-dimethylglyoxime, bis-o-(p-toluenesulfonyl)-α-diphenylglyoxime, bis-o-(p-toluenesulfonyl)-α-dicyclohexylglyoxime, bis-o-(p-toluenesulfonyl)-2,3-pentanedioneglyoxime, bis-o-(p-toluenesulfonyl)-2-methyl-3,4-pentanedioneglyoxime, bis-o-(n-butanesulfonyl)-α-dimethylglyoxime, bis-o-(n-butanesulfonyl)-α-diphenylglyoxime, bis-o-(n-butanesulfonyl)-α-dicyclohexylglyoxime, bis-o-(n-butanesulfonyl)-2,3-pentanedioneglyoxime, bis-o-(n-butanesulfonyl)-2-methyl-3,4-pentanedioneglyoxime, bis-o-(methanesulfonyl)-α-dimethylglyoxime, bis-o-(trifluoromethanesulfonyl)-α-dimethylglyoxime, bis-o-(1,1,1-trifluoroethanesulfonyl)-α-dimethylglyoxime, bis-o-(tert-butanesulfonyl)-α-dimethylglyoxime, bis-o-(perfluorooctanesulfonyl)-α-dimethylglyoxime, bis-o-(cyclohexanesulfonyl)-α-dimethylglyoxime, bis-o-(benzenesulfonyl)-α-dimethylglyoxime, bis-o-(p-fluorobenzenesulfonyl)-α-dimethylglyoxime, bis-o-(p-tert-butylbenzenesulfonyl)-α-dimethylglyoxime, bis-o-(xylenesulfonyl)-α-dimethylglyoxime, and bis-o-(camphorsulfonyl)-α-dimethylglyoxime;

β-ketosulfone derivatives such as 2-cyclohexylcarbonyl-2-(p-toluenesulfonyl)propane and 2-isopropylcarbonyl-2-(p-toluenesulfonyl)propane;

disulfone derivatives such as diphenyl disulfone and dicyclohexyl disulfone;

nitrobenzyl sulfonate derivatives such as 2,6-dinitrobenzyl p-toluenesulfonate and 2,4-dinitrobenzyl p-toluenesulfonate;

sulfonic acid ester derivatives such as 1,2,3-tris(methanesulfonyloxy)benzene, 1,2,3-tris(trifluoromethanesulfonyloxy)benzene, and 1,2,3-tris(p-toluenesulfonyloxy)benzene; and imidoyl sulfonate derivatives such as phthalimidoyl triflate, phthalimidoyl tosylate, 5-norbornene-2,3-dicarboxyimidoyl triflate, 5-norbornene-2,3-dicarboxyimidoyl tosylate, and 5-norbornene-2,3-dicarboxyimidoyl n-butylsulfonate.

Preferred among these photoacid generators are onium salts such as triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, and tris(p-tert-butoxyphenyl)sulfonium p-toluenesulfonate; diazomethane derivatives such as bis(benzenesulfonyl)diazomethane, bis(p-toluenesulfonyl)diazomethane, bis(cyclohexylsulfonyl) diazomethane, bis(n-butylsulfonyl)diazomethane, bis(isobutylsulfonyl)diazomethane, bis(sec-butylsulfonyl) diazomethane, bis(n-propylsulfonyl)diazomethane, bis(isopropylsulfonyl)diazomethane, and bis(tert-butylsulfonyl)diazomethane; and glyoxime derivatives such as bis-o-(p-toluenesulfonyl)-α-dimethylglyoxime and bis-o-(n-butanesulfonyl)-α-dimethylglyoxime. These photoacid generators may be used singly or in combinations of two or more thereof. Onium salts are effective for improving rectangularity, while diazomethane derivatives and glyoxime derivatives are effective for reducing standing waves. The combination of an onium salt with a diazomethane or a glyoxime derivative allows for fine adjustment of the profile.

The photoacid generator is preferably added in an amount of about 0.2 to 15 parts by weight, and especially about 0.5 to 8 parts by weight, per 100 parts by weight of all the base resins. At less than 0.2 part, the amount of acid generated during exposure would be too small and the sensitivity and resolution are poor, whereas the addition of more than 15 parts would lower the transmittance of the resist and results in a poor resolution.

Component (D)

The basic compound used as component (E) is preferably a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure, thus reducing substrate and environment dependence, as well as improving the exposure latitude and the pattern profile. See JP-A 5-232706, 5-249683, 5-158239, 5-249662, 5-257282, 5-289322, and 5-289340.

Examples of suitable basic compounds include primary, secondary, and tertiary aliphatic amines, mixed amines, aromatic amines, heterocyclic amines, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, amide derivatives, and imide derivatives. Of these, aliphatic amines are especially preferred.

Examples of suitable primary aliphatic amines include ammonia, methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'- tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable carboxyl group-bearing nitrogenous compounds include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable sulfonyl group-bearing nitrogenous compounds include 3-pyridinesulfonic acid and pyridinium p-toluenesulfonate. Examples of suitable hydroxyl group-bearing nitrogenous compounds, hydroxyphenyl group-bearing nitrogenous compounds, and alcoholic nitrogenous compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]-piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

In addition, basic compounds of the following general formulas (9) and (10) may also be included.

(9)

(10)

In the formulas, $R^{41}$, $R^{42}$, $R^{43}$, $R^{47}$ and $R^{48}$ independently straight, branched or cyclic alkylenes of 1 to 20 carbon atoms; $R^{44}$, $R^{45}$, $R^{46}$, $R^{49}$ and $R^{50}$ are hydrogen, alkyls of 1 to 20 carbon atoms, or amino; $R^{44}$ and $R^{45}$, $R^{45}$ and $R^{46}$, $R^{44}$ and $R^{46}$, $R^{44}$ with $R^{45}$ and $R^{46}$, and $R^{49}$ and $R^{50}$ may bond together to form rings; and S, T and U are each integers from 0 to 20, with the proviso that hydrogen is excluded from $R^{44}$, $R^{45}$, $R^{46}$, $R^{49}$ and $R^{50}$ when S, T and U are equal to 0.

The alkylene groups represented by $R^{41}$, $R^{42}$, $R^{43}$, $R^{47}$ and $R^{48}$ preferably have 1 to 20 carbon atoms, more preferably 1 to 10 carbon atoms, and most preferably 1 to 8 carbon atoms. Examples include methylene, ethylene, n-propylene, isopropylene, n-butylene, isobutylene, n-pentylene, isopentylene, hexylene, nonylene, decylene, cyclopentylene, and cyclohexylene.

The alkyl groups represented by $R^{44}$, $R^{45}$, $R^{46}$, $R^{49}$ and $R^{50}$ preferably have 1 to 20 carbon atoms, more preferably 1 to 8 carbon atoms, and most preferably 1 to 6 carbon atoms, and may be straight, branched or cyclic. Examples include methyl, ethyl, n-propyl, isopropyl, n-butyl, isobutyl, tert-butyl, n-pentyl, isopentyl, hexyl, nonyl, decyl, dodecyl, tridecyl, cyclopentyl, and cyclohexyl.

Where $R^{44}$ and $R^{45}$, $R^{45}$ and $R^{46}$, $R^{44}$ and $R^{46}$, $R^{44}$ with $R^{45}$ and $R^{46}$, and $R^{49}$ and $R^{50}$ form rings, the rings preferably have 1 to 20 carbon atoms, more preferably 1 to 8 carbon atoms, and most preferably 1 to 6 carbon atoms, and may have branching alkyl groups of 1 to 6 carbon atoms, and especially 1 to 4 carbon atoms.

S, T, and U are each integers from 0 to 20, preferably from 1 to 10, and more preferably from 1 to 8.

Illustrative examples of the compounds of formulas (9) and (10) include tris{2-(methoxymethoxy)ethyl}amine, tris{2-(methoxyethoxy)ethyl}amine, tris[2-{(2-methoxyethoxy)methoxy}ethyl]amine, tris{2-(2-methoxyethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15- crown-5, and 1-aza-18-crown-6. Especially preferred basic compounds are tertiary amines, aniline derivatives, pyrrolidine derivatives, pyridine derivatives, quinoline derivatives, amino acid derivatives, hydroxyl group-bearing nitrogenous compounds, hydroxyphenyl group-bearing nitrogenous compounds, alcoholic nitrogenous compounds, amide derivatives, imide derivatives, tris{2-(methoxymethoxy)ethyl}amine, tris{2-(2-methoxyethoxy)ethyl}amine, tris[2-{(2-methoxyethoxy)methyl}ethyl]amine, and 1-aza-15-crown-5.

The above-described basic compound may be used singly or in combinations of two or more thereof, and is preferably formulated in an amount of about 0.01 to 2 parts, and especially about 0.01 to 1 part by weight, per 100 parts by weight of all the base resins. At less than 0.01 part, the desired effects of the basic compound would not be apparent, while the use of more than 2 parts would result in too low a sensitivity.

Component (E)

The dissolution inhibitor (E) is a compound with a molecular weight of up to 3,000 which changes its solubility in an alkaline developer under the action of an acid. Typically, a compound obtained by partially or entirely substituting acid labile substituents on a phenol or carboxylic acid derivative having a molecular weight of up to 2,500 is added as the dissolution inhibitor.

Examples of the phenol or carboxylic acid derivative having a molecular weight of up to 2,500 include bisphenol A, bisphenol H, bisphenol S, 4,4-bis(4'-hydroxyphenyl) valeric acid, tris(4-hydroxyphenyl)methane, 1,1,1-tris(4'-hydroxyphenyl)ethane, 1,1,2-tris(4'-hydroxyphenyl)ethane, phenolphthalein, and thimolphthalein. The acid labile substituents are the same as illustrated above.

Illustrative, non-limiting, examples of the dissolution inhibitors which are useful herein include bis(4-(2'-tetrahydropyranyloxy)phenyl)methane, bis(4-(2'-tetrahydrofuranyloxy)phenyl)methane, bis(4-tert-butoxyphenyl)methane, bis(4-tert-butoxycarbonyloxyphenyl)methane, bis(4-tert-butoxycarbonylmethyloxyphenyl)methane, bis(4-(1'-ethoxyethoxy)phenyl)methane, bis(4-(1'-ethoxypropyloxy)phenyl)methane, 2,2-bis(4'-(2"-tetrahydropyranyloxy))propane, 2,2-bis(4'-(2"-tetrahydrofuranyloxy)phenyl)propane, 2,2-bis(4'-tert-butoxyphenyl)propane, 2,2-bis(4'-tert-butoxycarbonyloxyphenyl)propane, 2,2-bis(4-tert-butoxycarbonylmethyloxyphenyl)propane, 2,2-bis(4'-(1"-ethoxyethoxy)phenyl)propane, 2,2-bis(4'-(1"-ethoxypropyloxy)phenyl)propane, tert-butyl 4,4-bis(4'-(2"-tetrahydropyranyloxy)phenyl)valerate, tert-butyl 4,4-bis(4'-(2"-tetrahydrofuranyloxy)phenyl)valerate, tert-butyl 4,4-bis(4'-tert-butoxyphenyl)valerate, tert-butyl 4,4-bis(4-tert-butoxycarbonyloxyphenyl)valerate, tert-butyl 4,4-bis(4'-tert-butoxycarbonylmethyloxyphenyl)valerate, tert-butyl 4,4-bis(4'-(1"-ethoxyethoxy)phenyl)valerate, tert-butyl 4,4-bis(4'-(1"-ethoxypropyloxy)phenyl)valerate, tris(4-(2'-tetrahydropyranyloxy)phenyl)methane, tris(4-(2'-tetrahydrofuranyloxy)phenyl)methane, tris(4-tert-butoxyphenyl)methane, tris(4-tert-butoxycarbonyloxyphenyl)methane, tris(4-tert-butoxycarbonyloxymethylphenyl)methane, tris(4-(1'-ethoxyethoxy)phenyl)methane, tris(4-(1'-ethoxypropyloxy) phenyl)methane, 1,1,2-tris(4'-(2"-tetrahydropyranyloxy) phenyl)ethane, 1,1,2-tris(4'-(2"-tetrahydrofuranyloxy) phenyl)ethane, 1,1,2-tris(4'-tert-butoxyphenyl)ethane, 1,1,2-tris(4'-tert-butoxycarbonyloxyphenyl)ethane, 1,1,2-tris(4'-tert-butoxycarbonylmethyloxyphenyl)ethane, 1,1,2-tris(4'-(1'-ethoxyethoxy)phenyl)ethane, and 1,1,2-tris(4'-(1'-ethoxypropyloxy)phenyl)ethane.

In the resist composition according to the invention, an appropriate amount of the dissolution inhibitor (E) is up to about 20 parts, and especially up to about 15 parts by weight per 100 parts by weight of the solids in the composition. With more than 20 parts of the dissolution inhibitor, the resist composition becomes less heat resistant because of an increased content of monomer components.

The resist composition of the invention may include, as an optional ingredient, a surfactant which is commonly used for improving the coating characteristics. Optional ingredients may be added in conventional amounts so long as this does not compromise the objects of the invention.

A nonionic surfactant is preferred, examples of which include perfluoroalkyl polyoxyethylene ethanols, fluorinated alkyl esters, perfluoroalkylamine oxides, and fluorinated organosiloxane compounds. Illustrative examples include Florade FC-430 and FC-431 from Sumitomo 3M Ltd., Surflon S-141, S-145, S-381 and S-383 from Asahi Glass Co., Ltd., Unidyne DS-401, DS-403, and DS-451 from Daikin Industries Ltd., Megaface F-8151, F-171, F-172, F-173 and F-177 from Dainippon Ink & Chemicals, Inc., and X-70-092 and X-70-093 from Shin-Etsu Chemical Co., Ltd. Preferred surfactants include Florade FC-430 from Sumitomo 3M Ltd. and X-70-093 from Shin-Etsu Chemical Co., Ltd.

Pattern formation using the chemical amplification resist composition of the invention may be carried out by a known lithographic technique. For example, the resist composition may be applied onto a substrate such as a silicon wafer by spin coating or the like to form a resist film having a thickness of 0.1 to 1.0 $\mu$m, which is then pre-baked on a hot plate at 60 to 200° C. for 10 seconds to 10 minutes, and preferably at 80 to 150° C. for ½ to 5 minutes. A patterning mask having the desired pattern may then be placed over the resist film, and the film exposed through the mask to an electron beam or to high-energy radiation such as deep-UV rays having a wavelength below 300 nm, an excimer laser, or x-rays in a dose of about 1 to 200 mJ/cm$^2$, and preferably about 10 to 100 mJ/cm$^2$, then post-exposure baked (PEB) on a hot plate at 60 to 150° C. for 10 seconds to 5 minutes, and preferably at 80 to 130° C. for ½ to 3 minutes. Finally, development may be carried out using as the developer an aqueous alkali solution, such as 0.1 to 5%, and preferably 2 to 3%, tetramethylammonium hydroxide (TMAH), this being done by a conventional method such as dipping, puddling, or spraying for a period of 10 seconds to 3 minutes, and preferably 30 seconds to 2 minutes. These steps result in the formation of the desired pattern on the substrate. Of the various types of high-energy radiation that may be used, the resist composition of the invention is best suited to fine pattern formation with, in particular, deep-UV rays having a wavelength of 254 to 120 nm, an excimer laser, especially ArF excimer laser (193 nm), $F_2$ excimer laser (157 nm), $Kr_2$ excimer laser (146 nm), KrAr excimer laser (134 nm) or $Ar_2$ excimer laser (126 nm), x-rays, or an electron beam. The desired pattern may not be obtainable outside the upper and lower limits of the above range.

The resist composition comprising the polymer of the invention is sensitive to high-energy radiation, has excellent sensitivity and resolution at a wavelength of less than 200 nm, especially less than 170 nm, and excellent plasma etching resistance. Because these features of the inventive resist composition enable its use particularly as a resist having a low absorption at the exposure wavelength of a $F_2$ excimer laser, a finely defined pattern having sidewalls perpendicular to the substrate can easily be formed, making the resist ideal as a micropatterning material in VLSI fabrication.

EXAMPLE

Examples of the invention are given below by way of illustration and not by way of limitation. The abbreviations used herein are AIBN for α,α'-azobisisobutyronitrile, GPC for gel permeation chromatography, Mw for weight average molecular weight, and Mn for number average molecular weight.

Synthesis Example 1

Synthesis of poly(1-ethylcyclopentyl 2,3,3-trifluoroacrylate)

In a 500-ml flask, 25 g of 1-ethylcyclopentyl 2,3,3-trifluoroacrylate was dissolved in 120 ml of toluene, oxygen was thoroughly purged from the system, and 0.74 g of an initiator AIBN was admitted. The flask was heated to 60° C., at which polymerization reaction was effected for 24 hours.

To purify the resulting polymer, the reaction mixture was poured into methanol whereupon the polymer precipitated. The procedure of dissolving the collected polymer in acetone and pouring into 5 liters of methanol for precipitation was repeated twice. The polymer was separated and dried. There was obtained 19.5 g of a white polymer, poly(1-ethylcyclopentyl 2,3,3-trifluoroacrylate). This polymer was found to have a Mw of 9,800 g/mol as measured by the light scattering method and a dispersity (Mw/Mn) of 1.90 as determined from the GPC elution curve.

Synthesis Example 2

Synthesis of poly(2-ethylnorbornyl 2,3,3-trifluoroacrylate)

In a 500-ml flask, 25 g of 2-ethylnorbornyl 2,3,3-trifluoroacrylate was dissolved in 120 ml of toluene, oxygen was thoroughly purged from the system, and 0.66 g of an initiator AIBN was admitted. The flask was heated to 60° C., at which polymerization reaction was effected for 24 hours.

To purify the resulting polymer, the reaction mixture was poured into methanol whereupon the polymer precipitated. The procedure of dissolving the collected polymer in acetone and pouring into 5 liters of methanol for precipitation was repeated twice. The polymer was separated and dried. There was obtained 20.3 g of a white polymer, poly(2-ethylnorbornyl 2,3,3-trifluoroacrylate). This polymer was found to have a Mw of 10,500 g/mol as measured by the light scattering method and a dispersity (Mw/Mn) of 1.85 as determined from the GPC elution curve.

Synthesis Example 3

Synthesis of poly(adamantyl 2,3,3-trifluoroacrylate)

In a 500-ml flask, 25 g of adamantyl 2,3,3-trifluoroacrylate was dissolved in 120 ml of toluene, oxygen was thoroughly purged from the system, and 0.63 g of an initiator AIBN was admitted. The flask was heated to 60° C., at which polymerization reaction was effected for 24 hours.

To purify the resulting polymer, the reaction mixture was poured into methanol whereupon the polymer precipitated. The procedure of dissolving the collected polymer in acetone and pouring into 5 liters of methanol for precipitation was repeated twice. The polymer was separated and dried. There was obtained 19.0 g of a white polymer, poly(adamantyl 2,3,3-trifluoroacrylate). This polymer was found to have a Mw of 11,000 g/mol as measured by the light scattering method and a dispersity (Mw/Mn) of 1.90 as determined from the GPC elution curve.

Synthesis Example 4

Synthesis of poly(t-butyl 2,3,3-trifluoroacrylate)

In a 500-ml flask, 25 g of t-butyl 2,3,3-trifluoroacrylate was dissolved in 120 ml of toluene, oxygen was thoroughly purged from the system, and 0.90 g of an initiator AIBN was admitted. The flask was heated to 60° C., at which polymerization reaction was effected for 24 hours.

To purify the resulting polymer, the reaction mixture was poured into methanol whereupon the polymer precipitated. The procedure of dissolving the collected polymer in acetone and pouring into 5 liters of methanol for precipitation was repeated twice. The polymer was separated and dried. There was obtained 18.5 g of a white polymer, poly(t-butyl 2,3,3-trifluoroacrylate). This polymer was found to have a Mw of 9,200 g/mol as measured by the light scattering method and a dispersity (Mw/Mn) of 1.95 as determined from the GPC elution curve.

Synthesis Example 5

Synthesis of poly(1-ethylcyclopentyl 3-trifluoromethyl-2,3-difluorooacrylate)

In a 500-ml flask, 25 g of 1-ethylcyclopentyl 3-trifluoromethyl-2,3-difluoroacrylate was dissolved in 120 ml of toluene, oxygen was thoroughly purged from the system, and 0.60 g of an initiator AIBN was admitted. The flask was heated to 60° C., at which polymerization reaction was effected for 24 hours.

To purify the resulting polymer, the reaction mixture was poured into methanol whereupon the polymer precipitated. The procedure of dissolving the collected polymer in acetone and pouring into 5 liters of methanol for precipitation was repeated twice. The polymer was separated and dried. There was obtained 20.5 g of a white polymer, poly(1-ethylcyclopentyl 3-trifluoromethyl-2,3-difluoroacrylate). This polymer was found to have a Mw of 11,000 g/mol as measured by the light scattering method and a dispersity (Mw/Mn) of 1.95 as determined from the GPC elution curve.

Synthesis Example 6

Synthesis of poly(1-ethylcyclopentyl 2-trifluoromethyl-3,3-difluoroacrylate)

In a 500-ml flask, 25 g of 1-ethylcyclopentyl 2-trifluoromethyl-3,3-difluoroacrylate was dissolved in 120 ml of toluene, oxygen was thoroughly purged from the system, and 0.60 g of an initiator AIBN was admitted. The flask was heated to 60° C., at which polymerization reaction was effected for 24 hours.

To purify the resulting polymer, the reaction mixture was poured into methanol whereupon the polymer precipitated. The procedure of dissolving the collected polymer in acetone and pouring into 5 liters of methanol for precipitation was repeated twice. The polymer was separated and dried. There was obtained 19.1 g of a white polymer, poly(1-ethylcyclopentyl 2-trifluoromethyl-3,3-difluoroacrylate). This polymer was found to have a Mw of 10,500 g/mol as measured by the light scattering method and a dispersity (Mw/Mn) of 1.92 as determined from the GPC elution curve.

Synthesis Example 7

Synthesis of adamantyl 2,3,3-trifluoroacrylate/γ-butyrolactone acrylate (6:4) copolymer In a 500-ml flask, 18 g of adamantyl 2,3,3-trifluoroacrylate and 10 g of γ-butyrolactone acrylate were dissolved in 120 ml of toluene, oxygen was thoroughly purged from the system, and 0.63 g of an initiator AIBN was admitted. The flask was heated to 60° C., at which polymerization reaction was effected for 24 hours.

To purify the resulting polymer, the reaction mixture was poured into methanol whereupon the polymer precipitated. The procedure of dissolving the collected polymer in acetone and pouring into 5 liters of methanol for precipitation was repeated twice. The polymer was separated and dried. There was obtained 19.0 g of a white polymer, poly(adamantyl 2,3,3-trifluoroacrylate-co-γ-butyrolactone acrylate). This polymer was found to have a Mw of 9,500 g/mol as measured by the light scattering method and a dispersity (Mw/Mn) of 2.05 as determined from the GPC elution curve. The polymer was also found from the measurement of 1H-NMR to have adamantyl 2,3,3-trifluoroacrylate and γ-butyrolactone acrylate in a ratio of 6:4.

Synthesis Example 8

Synthesis of adamantyl 2,3,3-trifluoroacrylate/5-oxo-4-oxatricyclo[$4.2.1.0^{3,7}$]nonan-2-yl acrylate (6:4) copolymer In a 500-ml flask, 18 g of adamantyl 2,3,3-trifluoroacrylate and 12 g of 5-oxo-4-oxatricyclo[$4.2.1.0^{3,7}$]nonan-2-yl acrylate were dissolved in 120 ml of toluene, oxygen was thoroughly purged from the system, and 0.63 g of an initiator AIBN was admitted. The flask was heated to 60° C., at which polymerization reaction was effected for 24 hours.

To purify the resulting polymer, the reaction mixture was poured into methanol whereupon the polymer precipitated. The procedure of dissolving the collected polymer in acetone and pouring into 5 liters of methanol for precipitation was repeated twice. The polymer was separated and dried. There was obtained 19.0 g of a white polymer, poly(adamantyl 2,3,3-trifluoroacrylate-co-5-oxo-4-oxatricyclo[$4.2.1.0^{3,7}$]nonan-2-yl acrylate). This polymer was found to have a Mw of 9,000 g/mol as measured by the light scattering method and a dispersity (Mw/Mn) of 2.02 as determined from the GPC elution curve. The copolymer was also found from the measurement of 1H-NMR to have the compositional ratio of 6:4.

Synthesis Example 9

Synthesis of adamantyl 2-trifluoromethylacrylate/5-oxo-4-oxatricyclo[$4.2.1.0^{3,7}$]nonan-2-yl acrylate (5:5) copolymer In a 500-ml flask, 18 g of adamantyl 2-trifluoromethylacrylate and 10 g of 5-oxo-4-oxatricyclo[$4.2.1.0^{3,7}$]-nonan-2-yl acrylate were dissolved in 120 ml of toluene, oxygen was thoroughly purged from the system, and 0.63 g of an initiator AIBN was admitted. The flask was heated to 60° C., at which polymerization reaction was effected for 24 hours.

To purify the resulting polymer, the reaction mixture was poured into methanol whereupon the polymer precipitated. The procedure of dissolving the collected polymer in acetone and pouring into 5 liters of methanol for precipitation was repeated twice. The polymer was separated and dried. There was obtained 19.6 g of a white polymer, poly(adamantyl 2-trifluoromethylacrylate-co-5-oxo-4-oxatricyclo[$4.2.1.0^{3,7}$]nonan-2-yl acrylate). This polymer was found to have a Mw of 8,000 g/mol as measured by the light scattering method and a dispersity (Mw/Mn) of 1.85 as determined from the GPC elution curve.

Comparative Polymers

A polymer, designated Comparative Polymer 1, was synthesized from a monodisperse polyhydroxystyrene having a molecular weight of 10,000 and a dispersity (Mw/Mn) of 1.10 by substituting tetrahydropyranyl groups for 30% of the hydroxyl groups. Comparative Polymer 2 was poly(methyl methacrylate) having a molecular weight of 15,000 and a dispersity of 1.7. Comparative Polymer 3 was a novolac polymer having a meta/para ratio of 40/60, a molecular weight of 9,000 and a dispersity of 2.5.

Next, each of the polymers of Synthesis Examples (SE) 1 to 8 and Comparative Polymers 1 to 3, 1 g, was thoroughly dissolved in 10 g of propylene glycol monomethyl ether acetate, and passed through a 0.2-μm filter, obtaining a polymer solution.

The polymer solution was spin coated onto a $MgF_2$ substrate and baked on a hot plate at 100° C. for 90 seconds, forming a polymer layer of 300 nm thick on the $MgF_2$ substrate. Using a vacuum ultraviolet spectrometer (VUV200S by Nihon Bunko K.K.), the polymer layer was measured for transmittance at 248 nm, 193 nm and 157 nm. The results are shown in Table 1.

TABLE 1

| Polymer | Transmittance (%) at 248 nm | Transmittance (%) at 193 nm | Transmittance (%) at 157 nm |
| --- | --- | --- | --- |
| Polymer of SE1 | 93 | 90 | 30 |
| Polymer of SE2 | 92 | 90 | 30 |
| Polymer of SE3 | 92 | 90 | 25 |
| Polymer of SE4 | 93 | 89 | 29 |
| Polymer of SE5 | 94 | 90 | 30 |
| Polymer of SE6 | 93 | 88 | 28 |
| Polymer of SE7 | 92 | 85 | 22 |
| Polymer of SE8 | 91 | 84 | 21 |
| Polymer of SE9 | 92 | 85 | 22 |
| Comparative Polymer 1 | 85 | 1 | 3 |
| Comparative Polymer 2 | 90 | 70 | 1 |
| Comparative Polymer 3 | 70 | 1 | 6 |

Examples and Comparative Examples

Resist solutions were prepared in a conventional manner by formulating the polymer, photoacid generator, basic compound, dissolution inhibitor and solvent in the amounts shown in Table 2.

On silicon wafers, DUV-30 (Nissan Chemical K.K.) was coated to form films of 55 nm thick so that the reflectance to KrF light (248 nm) was reduced below 1%. On the coated substrates, the resist solutions were spin coated, then baked on a hot plate at 100° C. for 90 seconds to give resist films having a thickness of 300 nm.

Using an excimer laser stepper (NSR-2005EX8A, from Nikon Corporation; NA 0.5, σ 0.7, ordinary illumination), the resist films were exposed stepwise while changing the dose every exposure area of 4 mm by 4 mm. Immediately after exposure, the resist films were baked at 110° C. for 90 seconds and then developed for 60 seconds with a 2.38% aqueous solution of tetramethylammonium hydroxide. The relationship of resist film retentivity to exposure dose was determined. The dose at which the resist film thickness was zero is designated Eth which is the sensitivity of the resist. The results are also shown in Table 2.

TABLE 2

| Polymer (pbw) | Photoacid generator (pbw) | Basic compound (pbw) | Solvent (pbw) | Dissolution inhibitor (pbw) | Eth sensitivity (mJ/cm$^2$) |
| --- | --- | --- | --- | --- | --- |
| SE1 (100) | PAG1 (2) | TBA (0.1) | PGMEA (900) | — | 25 |
| SE2 (100) | PAG1 (2) | TBA (0.1) | PGMEA (900) | — | 20 |
| SE3 (100) | PAG1 (2) | TBA (0.1) | PGMEA (900) | — | 28 |

TABLE 2-continued

| Polymer (pbw) | Photoacid generator (pbw) | Basic compound (pbw) | Solvent (pbw) | Dissolution inhibitor (pbw) | Eth sensitivity (mJ/cm$^2$) |
|---|---|---|---|---|---|
| SE4 (100) | PAG1 (2) | TBA (0.1) | PGMEA (900) | — | 38 |
| SE5 (100) | FAG1 (2) | TBA (0.1) | PGMEA (900) | — | 22 |
| SE6 (100) | PAG1 (2) | TBA (0.1) | PGMEA (900) | — | 18 |
| SE7 (100) | PAG1 (2) | TBA (0.1) | PGMEA (900) | — | 27 |
| SE8 (100) | PAG1 (2) | TBA (0.1) | PGMEA (900) | — | 22 |
| SE9 (100) | PAG1 (2) | TBA (0.1) | PGMEA (900) | — | 25 |
| SE1 (100) | PAG1 (2) | TBA (0.1) | PGMEA (900) | DRI1 (10) | 22 |
| SE1 (100) | PAG2 (2) | TBA (0.1) | PGMEA (900) | — | 12 |
| SE1 (100) | PAG1 (2) | TEA (0.1) | PGMEA (900) | — | 23 |
| SE1 (100) | PAG1 (2) | TMMEA (0.2) | PGMEA (900) | — | 25 |

PGMEA: propylene glycol monomethyletheracetate

PAG1

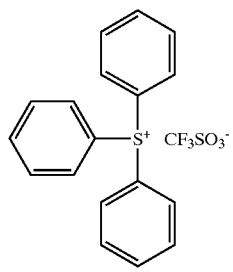

PAG2

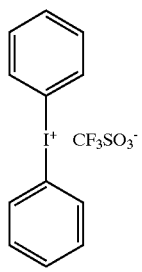

DRI1

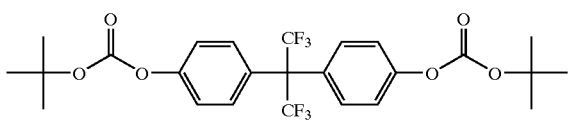

TMMEA

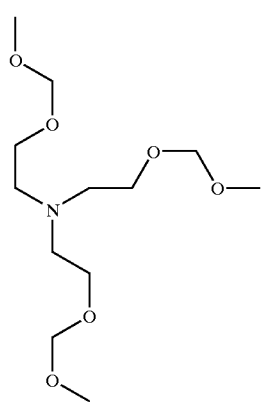

As is evident from Tables 1 and 2, resist materials using the polymers of the invention have sufficient transparency at the wavelength (157 nm) of F$_2$ excimer laser. They exhibit positive resist characteristics in that as the dose of KrF exposure increases, the thickness of the resist film left decreases.

Japanese Patent Application No. 11-356220 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A polymer comprising recurring units of an acrylic derivative of fluorinated backbone represented by the following general formula (1):

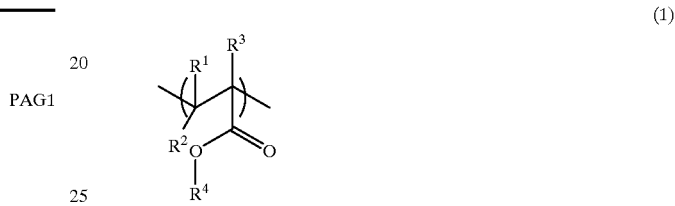

wherein

R$^1$, R$^2$ and R$^3$ are independently hydrogen, fluorine or unsubstituted or fluorinated, straight, branched or cyclic alkyl groups of 1 to 20 carbon atoms, at least one of R$^1$ and R$^2$ contains fluorine, R$^4$ is selected from the group consisting of:
trialkylsilyl groups whose alkyl groups each have 1 to 6 carbon atoms,
oxoalkyl groups of 4 to 20 carbon atoms,
groups of formulas (2) and (3), and
tertiary alkyl groups of formula (4) having 4 to 40 carbon atoms:

wherein

R$^6$ is a tertiary alkyl group of 4 to 20 carbon atoms, trialkylsilyl whose alkyl groups each have 1 to 6 carbon atoms, an oxoalkyl group of 4 to 20 carbon atoms or a group of formula (4), a is an integer of 0 to 6, R$^7$ and R$^8$ are each independently hydrogen or straight, branched or cyclic alkyl groups of 1 to 18 carbon atoms, R$^9$ is a monovalent hydrocarbon group of 1 to 18 carbon atoms, which optionally contains a hetero atom, in which some hydrogen atoms are optionally replaced by hydroxyl, alkoxy, oxo, amino or alkylamino groups, additionally, a pair of $R^7$ and $R^8$, a pair of $R^7$ and $R^9$, or a pair of $R^8$ and $R^9$, taken together, may form a ring in which each of $R^7$, $R^8$ and $R^9$ is a straight or branched alkylene group of 1 to 18 carbon atoms, and $R^{10}$, $R^{11}$ and $R^{12}$ are each independently monovalent hydrocarbon groups, optionally containing a hetero atom selected from oxygen, sulfur, nitrogen and fluorine, additionally, a pair of $R^{10}$ and $R^{11}$, a pair of $R^{10}$ and $R^{12}$, or a pair of $R^{11}$ and $R^{12}$, taken together, may form a ring.

2. A resist composition comprising the polymer of claim 1.

3. A process for forming a pattern, comprising:

applying the resist composition of claim 2 onto a substrate to form a coating;

heat treating the coating and exposing the coating to high energy radiation with a wavelength of up to 300 nm or an electron beam through a photo-mask; optionally heat treating the exposed coating; and developing the coating with a developer.

4. A process for forming a pattern, comprising:

applying the resist composition of claim 2 onto a substrate to form a coating, heat treating the coating and exposing the coating to high energy radiation with a wavelength of up to 300 nm or an electron beam through a photo-mask, heat treating the exposed coating, and developing the coating with a developer.

5. A polymer according to claim 1, wherein $R^1$, $R^2$ and $R^3$ are each, independently, hydrogen, fluorine or a straight, branched or cyclic alkyl group having 1 to 12 carbon atoms, wherein said alkyl group is unsubstituted or fluorinated.

6. A polymer according to claim 1, wherein $R^1$, $R^2$ and $R^3$ are each, independently, hydrogen, fluorine or a straight, branched or cyclic alkyl group having 1 to 10 carbon atoms, wherein said alkyl group is unsubstituted or fluorinated.

7. A polymer according to claim 1, wherein $R^1$, $R^2$ and $R^3$ are each, independently, hydrogen, fluorine, methyl, ethyl, propyl, isopropyl, n-butyl, sec-butyl, tert-butyl, cyclopentyl, cyclohexyl, 2-ethylhexyl, n-octyl, trifluoromethyl, 2,2,2-trifluoroethyl, 3,3,3-trifluoropropyl, or, 1,2,2,3,3,3-heptafluoropropyl.

8. A polymer according to claim 1, wherein $R^6$ is a tertiary alkyl group of 4 to 15 carbon atoms, trialkylsilyl whose alkyl groups each have 1 to 6 carbon atoms, an oxoalkyl group of 4 to 20 carbon atoms or a group of formula (4), $R^7$ and $R^8$ are each independently a hydrogen or straight, branched or cyclic alkyl group of 1 to 10 carbon atoms, $R^9$ is a straight, branched or cyclic alkyl group of 1 to 18 carbon atoms, in which some hydrogen atoms are optionally replaced by hydroxyl, oxo, amino or alkylamino groups, and $R^{10}$, $R^{11}$ and $R^{12}$ are each independently a straight, branched or cyclic alkyl group of 1 to 20 carbon atoms, which optionally contains a hetero atom selected from oxygen, sulfur, nitrogen and fluorine.

9. A polymer according to claim 1, wherein $R^6$ is tert-butyl, tert-amyl, 1,1-diethylpropyl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, and 2-methyl-2-adamantyl, trimethylsilyl, triethylsilyl, dimethyl-tert-butylsilyl, 3-oxocyclohexyl, 4-methyl-2-oxooxan-4-yl, or 5-methyl-2-oxooxoran-5-yl, $R^7$ and $R^8$ are each independently hydrogen, methyl, ethyl, propyl, isopropyl, n-butyl, sec-butyl, tert-butyl, cyclopentyl, cyclohexyl, 2-ethylhexyl or n-octyl, $R^9$ is a one of the following groups

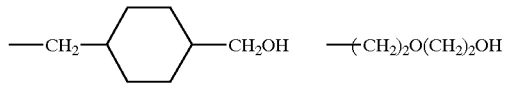

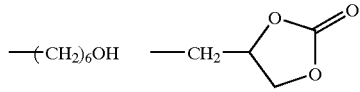

$R^{10}$, $R^{11}$ and $R^{12}$ are each independently a straight, branched or cyclic alkyl group of 1 or 20 carbon atoms, which optionally contains a hetero atom selected from oxygen, sulfur, nitrogen and fluorine.

10. A polymer according to claim 1, wherein the acid labile group of formula (2) is selected from tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyyloxycarbonylmethyl, and the acid laible group of formula (3) is selected from tetrahydrofuran-2-yl, 2-methyltetrahydrofuran-2-yl, tetrahydropyran-2-yl and 2-methyltetrahydropyran-2-yl, and the groups listed below

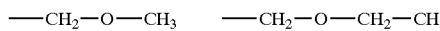

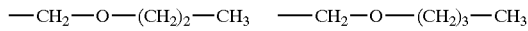

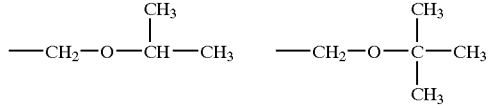

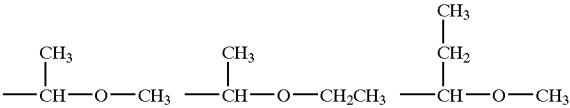

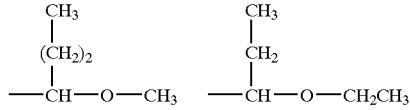

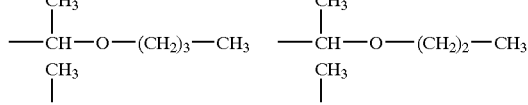

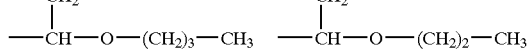

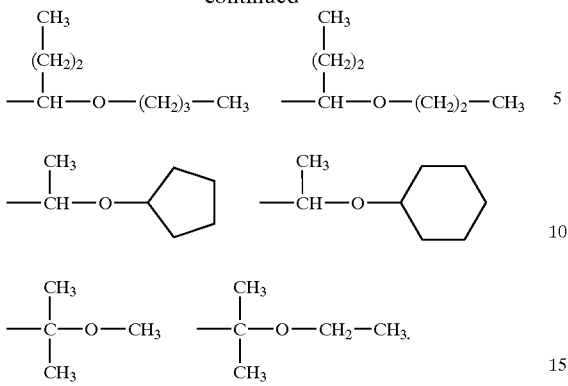

11. A polymer according to claim 10, wherein the group represented by formula (4) is selected from tert-butyl, triethylcarbyl, 1-ethylnorbornyl, 1-methylcyclohexyl, 1-ethylcyclopentyl, 2-(2-methyl)adamantyl, 2-(2-ethyl)adamantyl, tert-amyl, trimethylsilyl, triethylsilyl, tert-butyldimethylsilyl, 3-oxocyclohexyl and groups of the following formulae:

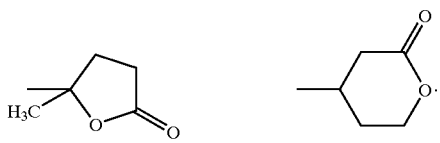

12. A polymer according to claim 10, wherein the tertiary alkyl group represented by formula (4) is selected from formulae (4-1) through (4-16)

(4-1)
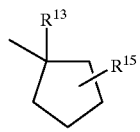

(4-2)
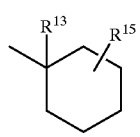

(4-3)
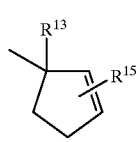

(4-4)
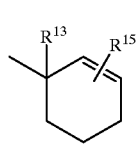

(4-5)
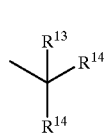

(4-6)
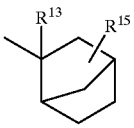

(4-7)
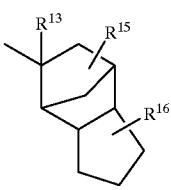

(4-8)
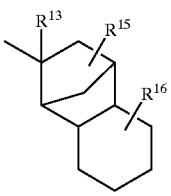

(4-9)
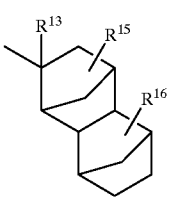

(4-10)
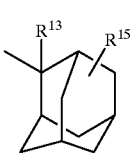

(4-11)
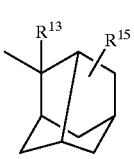

(4-12)
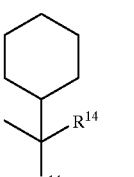

(4-13)
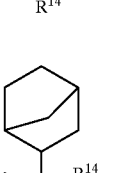

(4-14)

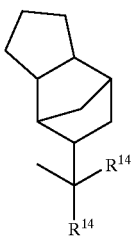

(4-15)

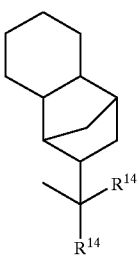

(4-16)

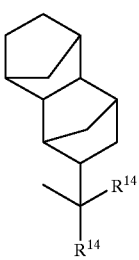

wherein

- $R^{13}$ and $R^{14}$ are each independently straight, branched or cyclic alkyl groups of 1 to 6 carbon atoms,
- $R^{15}$ is hydrogen or a monovalent hydrocarbon group of 1 to 6 carbon atoms which optionally contains a hetero atom selected from oxygen, sulfur and nitrogen atom, which is in the form of —OH, —OR, —O—, —S—, —S(=O)—, —NH$_2$, —NHR, —NR$_2$, —NH—, or —NR— wherein R is an alkyl group of 1 to 20 carbon atoms, and
- $R^{16}$ is hydrogen or an alkyl, hydroxyalkyl, alkoxy or alkoxyalkyl group of 1 to 20 carbon atoms, which may be straight, branched or cyclic.

13. A polymer according to claim 1, wherein the tertiary alkyl group represented by formula (4) is selected from formulae (4-1) through (4-16)

(4-1)

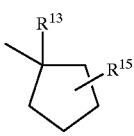

(4-2)

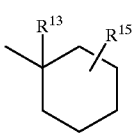

(4-3)

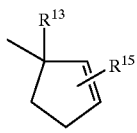

(4-4)

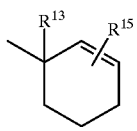

(4-5)

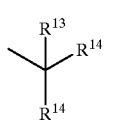

(4-6)

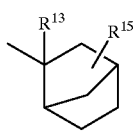

(4-7)

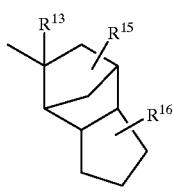

(4-8)

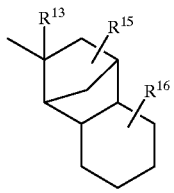

(4-9)

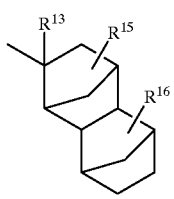

(4-10)

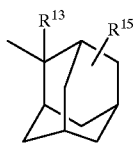

(4-11)

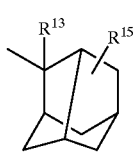

-continued (4-12) 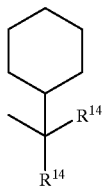

(4-13) 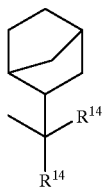

(4-14) 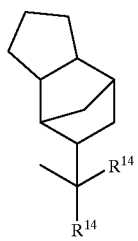

(4-15) 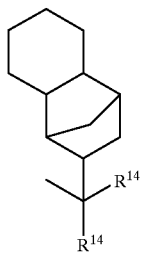

(4-16) 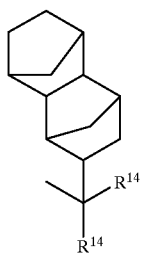

wherein
- $R^{13}$ and $R^{14}$ are each independently straight, branched or cyclic alkyl groups of 1 to 6 carbon atoms,
- $R^{15}$ is hydrogen or a monovalent hydrocarbon group of 1 to 6 carbon atoms which optionally contains a hetero atom selected from oxygen, sulfur and nitrogen atom, which is in the form of —OH, —OR, —O—, —S—, —S(=)—, —NH$_2$, —NHR, —NR$_2$, —NH—, or —NR— wherein R is an alkyl group of 1 to 20 carbon atoms, and
- $R^{16}$ is hydrogen or an alkyl, hydroxyalkyl, alkoxy or alkoxyalkyl group of 1 to 20 carbon atoms, which may be straight, branched or cyclic.

14. A polymer acording to claim 1, wherein said polymer further comprises one or more units selected from formulas (5-1) through (4-41):

(5-1) 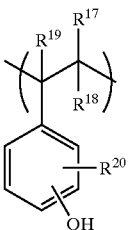

(5-2) 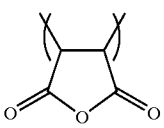

(5-3) 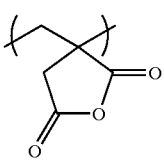

(5-4) 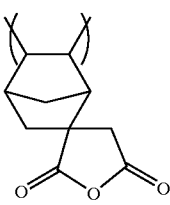

(5-5) 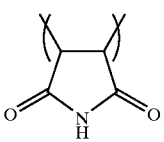

(5-6)

(5-7)

(5-8)

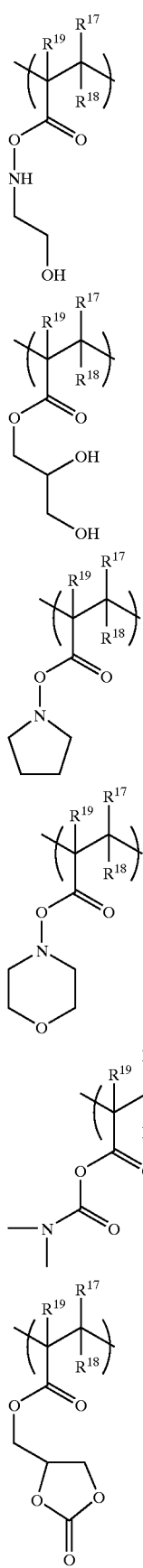
(5-9)
(5-10)
(5-11)
(5-12)
(5-13)
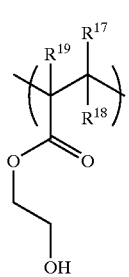
(5-15)
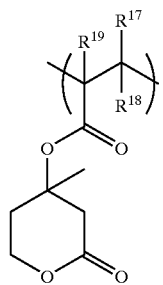
(5-16)
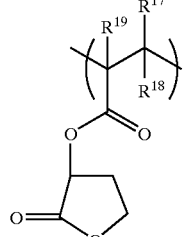
(5-17)
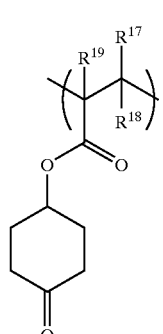
(5-18)
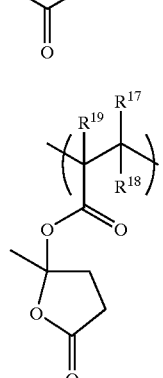
(5-19)
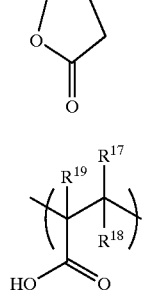
(5-20)

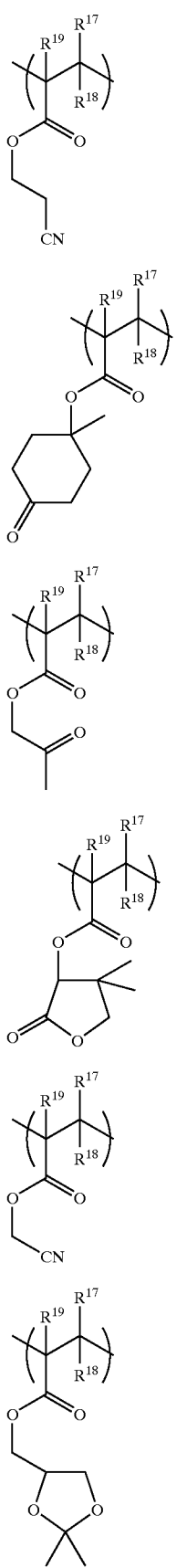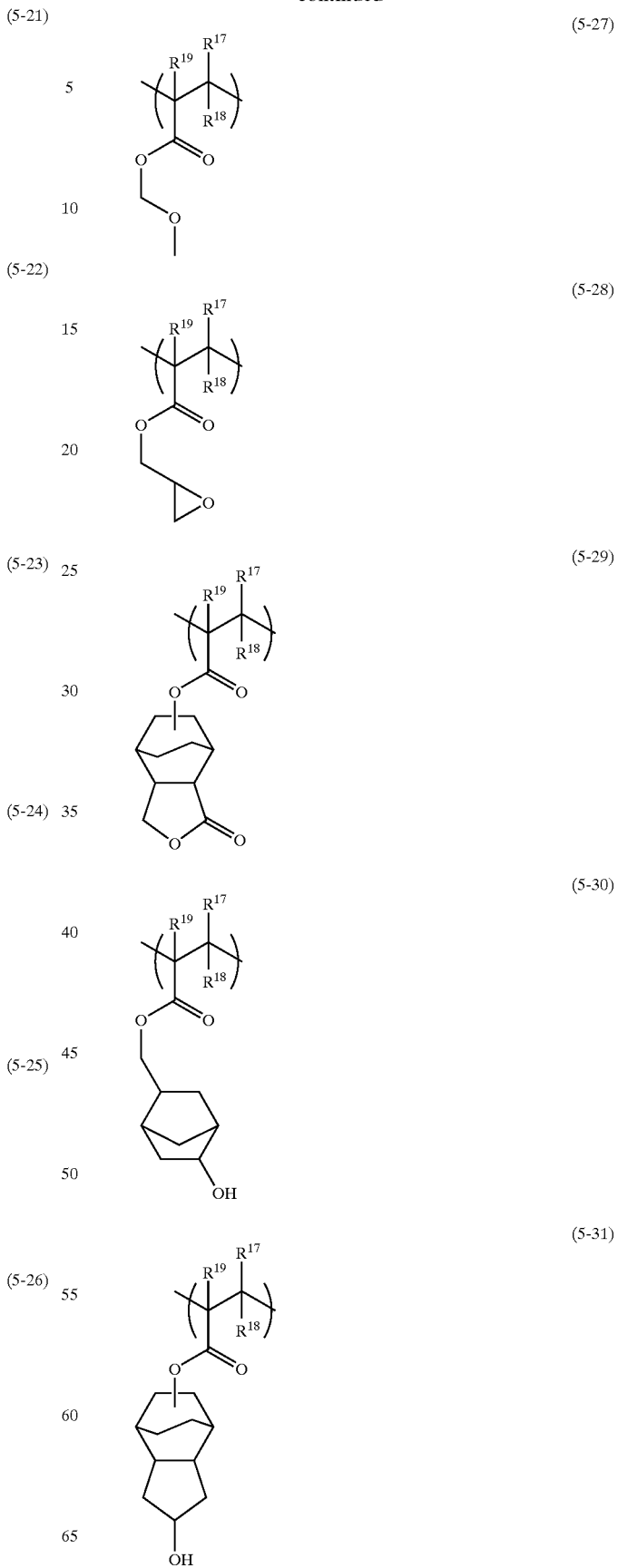

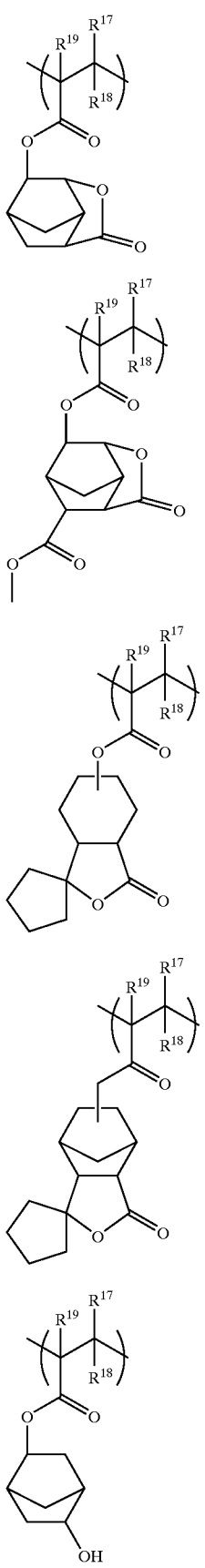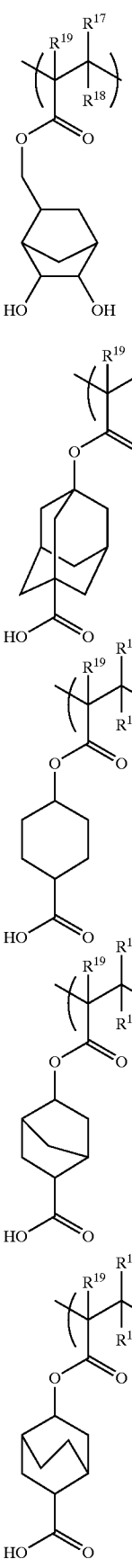

wherein $R^{17}$, $R^{18}$, $R^{19}$ and $R^{20}$ are each independently hydrogen, or a straight, branched or cyclic alkyl group of 1 to 20 carbon atoms.

15. In a process for forming a pattern, comprising:

applying a resist composition onto a substrate to form a coating;

heat treating the coating and exposing the coating to high energy radiation with a wavelength of up to 300 nm or an electron beam through a photo-mask;

optionally heat treating the exposed coating; and developing the coating with a developer, the improvement wherein said resist composition contains a polymer according to claim 1

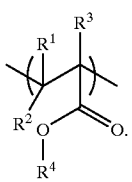
(1)

16. In a process for forming a pattern, comprising:

applying a resist composition onto a substrate to form a coating, heat treating the coating and exposing the coating to high energy radiation with a wavelength of up to 300 nm or an electron beam through a photo-mask, heat treating the exposed coating, and developing the coating with a developer, the improvement wherein said resist composition contains a polymer according to claim 1.

17. A chemical amplification, positive resist composition comprising (A) a polymer comprising (i) recurring units of an acrylic derivative of fluorinated backbone represented by the following general formula (1):

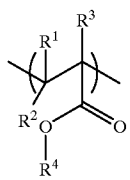
(1)

wherein $R^1$, $R^2$ and $R^3$ are independently hydrogen, fluorine or unsubstituted or fluorinated, straight, branched or cyclic alkyl groups of 1 to 20 carbon atoms, at least one of $R^1$, $R^2$ and $R^3$ contains fluorine, and $R^4$ is selected from the group consisting of:

trialkylsilyl groups whose alkyl groups each have 1 to 6 carbon atoms, oxoalkyl groups of 4 to 20 carbon atoms, groups of fromulas (2) and (3), and tertiary alkyl groups of formula (4) having 4 to 40 carbon atoms:

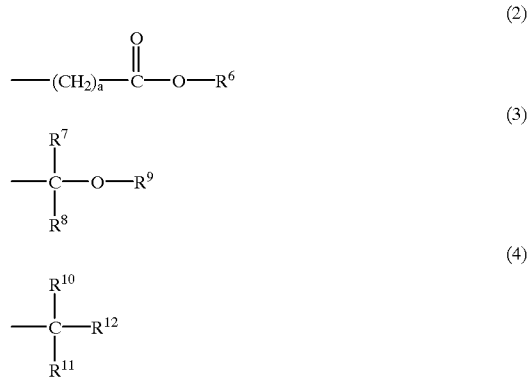

wherein $R^6$ is a tertiary alkyl group of 4 to 20 carbon atoms, trialkylsilyl whose alkyl groups each have 1 to 6 carbon atoms, an oxoalkyl group of 4 to 20 carbon atoms or a group of formula (4), a is an integer of 0 to 6, $R^7$ and $R^8$ are each independently hydrogen or straight, branched or cyclic alkyl groups of 1 to 18 carbon atoms, $R^9$ is a monovalent hydrocarbon group of 1 to 18 carbon atoms, which optionally contains a hetero atom, in which some hydrogen atoms are optionally replaced by hydroxyl, alkoxy, oxo, amino or alkylamino groups, additionally, a pair of $R^7$ and $R^8$, a pair of $R^7$ and $R^9$, or a pair of $R^8$ and $R^9$, taken together, may form a ring in which each of $R^7$, $R^8$ and $R^9$ is a straight or branched alkylene group of 1 to 18 carbon atoms, and $R^{10}$, $R^{11}$ and $R^{12}$ are each independently monovalent hydrocarbon groups, optionally containing a hetero atom selected from oxygen, sulfur, nitrogen and fluorine, additionally, a pair of $R^{10}$ and $R^{11}$, a pair of $R^{10}$ and $R^{12}$, or a pair of $R^{11}$ and $R^{12}$, taken together, may form a ring, and (ii) recurring units selected from the group of:
recurring units of scrylic acid derivatives represented by the following formula

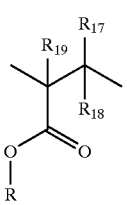

wherein $R^{17}$, $R^{18}$, and $R^{19}$ are hydrogen, or straight, branched or cyclic alkyl groups of 1 to 20 carbon atoms, and R is a hydrogen, an ether group, a lactone group, an ester group or a carbonyl-containing ester group, recurring units of norbornene derivatives, recurring units of maleic anhydride, and recurring units of malimide;

(B) an organic slovent; and (C) a photoacid generator.

18. The resist composition of claim 17 further comprising a basic compound.

19. A positive resist composition according to claim 18, wherein the basic compound is present in an amount of 0.01 to 2 parts by weight, per 100 parts by weight of all the base resins.

20. The resist composition of claim 17 further comprising a dissolution inhibitor.

21. A positive resist composition according to claim 20, wherein the dissolution inhibitor is present in an amount up to 20 parts by weight per 100 parts by weoght of the solids in the composition.

22. A process for forming a pattern, comprising:
applying the resist composition of claim 17 onto a substrate to form a coating;
heat treating the coating and exposing the coating to high energy radiation with a wavelength of up to 300 nm or an electron beam through a photo-mask;
optionally heat treating the exposed coating; and
developing the coating with a developer.

23. A process for forming a pattern, comprising:
applying the resist composition of claim 17 onto a substrate to form a coating,
heat treating the coating and exposing the coating to high energy radiation with a wavelength of up to 300 nm or an electron beam through a photo-mask,
heat treating the exposed coating, and developing the coating with a developer.

24. A positive resist composition according to claim 17, wherein component (B) is an organic solvent selected cyclohexanone, methyl-2-n-amylketone, 3-methoxybutanol, 3-methyl-3-methoxybutanol, 1-methoxy-2-propanol, 1-ethoxy-2propanol, propylene glycol monomethyl ether, ethylene glycol monomethyl ether, propylene glycol monoethyl ether, ethylene glycol monoethyl ether, propylene glycol dimethyl ether, diethylene glycol dimethyl ether; propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, and combinations thereof.

25. A positive resist composition according to claim 17, wherein component (B) is present in an amount of 200 to 5,000 parts by weight per 100 parts by weight of the base resin.

26. A positive resist composition according to claim 25, wherein component (C) is present in an amount of 0.2 to 15 parts by weight per 100 parts of all the base resins.

27. A positive resist composition according to claim 17, wherein compound (C) is selected from triphenylsulfonium trifluoromethanesulfonate, (p-tert-butoxyphenyl) diphenylsulfonium trifluoromethanesulfonate, tris(p-tert-butoxyphenyl)sulfonium trifluoromethanesulfonate, triphenylsulfonium p-toluenesulfonate, (p-tert-butoxyphenyl) diphenylsulfonium p-toluenesulfonate, and tris(p-tert-butoxyphenyl)sulfonium p-toluenesulfonate; diazomethane derivatives such as bis(benzenesulfonyl)diazomethane, bis (p-toluenesulfonyl)diazomethane, bis(cyclohexylsulfonyl) diazomethane, bis(n-butylsulfonyl)diazomethane, bis (isobutylsulfonyl)diazomethane, bis(sec-butylsulfonyl) diazomethane, bis(n-propylsulfonyl)diazomethane, bis (isopropylsulfonyl)diazomethane, and bis(tert-butylsulfonyl)diazomethane; and glyoxime derivatives such as bis-o-(p-toluenesulfonyl)-α-dimethylglyoxine and bis-o-(n-butanesulfonyl)-α-dimethylglyoxime.

28. A positive resist composition according to claim 17, wherein component (C) is present in an amount of 0.2 to 15 parts by weight per 100 parts by weight of all the base resins.

29. A chemical amplification, positive resist composition comprising:
(A) a polymer comprising recurring units of an acrylic derivative of fluorinated backbone represented by the following general formula (1):

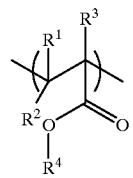
(1)

wherein $R^1$, $R^2$ and $R^3$ are independently hydrogen, fluorine or unsubstituted or fluorinated, straight, branched or cyclic alkyl groups of 1 to 20 carbon atoms, at least one of $R^1$, $R^2$ and $R^3$ contains fluorine, and $R^4$ is an acid labile group selected from trialkylsilyl groups whose alkyl groups each have 1 to 6 carbon atoms, oxoalkyl groups of 4 to 20 carbon atoms, group of formulas (2) and (3), and tertiary alkyl groups

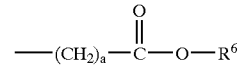
(2)

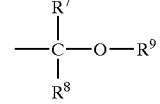
(3)

wherein
$R^6$ is a tertiary alkyl group of 4 to 20 carbon atoms whose alkyl groups each have 1 to 6 carbon atoms, an oxoalkyl group of 4 to 20 carbon atoms or a group of formula (4),

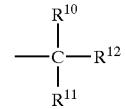
(4)

a is an integer of 0 to 6, $R^7$ and $R^8$ are each independently hydrogen or straight, branched or cyclic alkyl groups of 1 to 18 carbon atoms, $R^9$ is a monovalent hydrocarbon group of 1 to 18 carbon atoms, which optionally contains a hetero atom, in which some hydrogen atoms are optionally replaced by hydroxyl, alkoxy, oxo, amino or alkylamino groups, additionally, a pair of $R^7$ and $R^8$, a pair of $R^7$ and $R^9$, or a pair of $R^8$ and $R^9$, taken together, may form a ring in which each of $R^7$, $R^8$ and $R^9$ is a straight or branched alkylene group of 1 to 18 carbon atoms, and $R^{10}$, $R^{11}$ and $R^{12}$ are each independently monovalent hydrocarbon groups, optionally containing a hetero atom selected from oxygen, sulfur, nitrogen and fluorine, additionally, a pair of $R^{10}$ and $R^{11}$, a pair of $R^{10}$ and $R^{12}$, or a pair of $R^{11}$ and $R^{12}$, taken together, may form a ring, wherein said tertiary alkyl group for $R^4$ is selected from triethylcarbyl, 1-ethylnorbornyl, 1-methylcyclohexyl, 1-ethylcyclopentyl, 2-(2-methyl)adamantyl, 2-(2-ethyl)adamantyl, and groups selected from formulae (4-1) through (4-16)
(4-1)
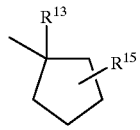
(4-2)
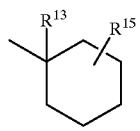
(4-3)
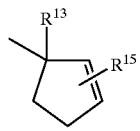
(4-4)
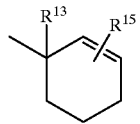
(4-5)
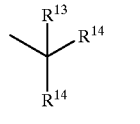
(4-6)
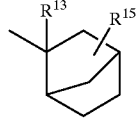
(4-7)
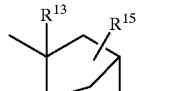
(4-8)
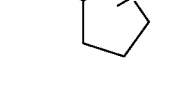
(4-9)
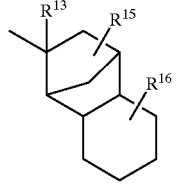
-continued
(4-10)
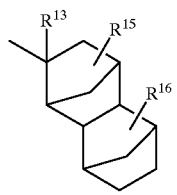
(4-11)
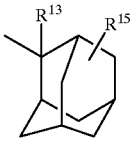
(4-12)
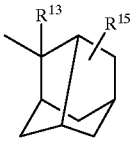
(4-13)
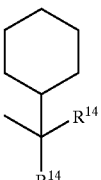
(4-14)
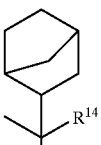
(4-15)
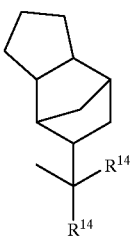
(4-16)
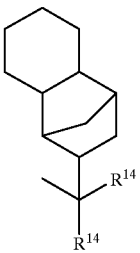
wherein
$R^{13}$ and $R^{14}$ are each independently straight, branched or cyclic alkyl groups of 1 to 6 carbon atoms, R[15] is hydrogen or a monovalent hydrocarbon group of 1 to 6 carbon atoms which optionally contains a hetero atom selected from oxygen, sulfur and nitrogen atom, which is in the form of —OH, —OR, —O—, —S—, —S(=O)—, —NH$_2$, —NHR, —NR$_2$, —NH—, or —NR— wherein R is an alkyl group of 1 to 20 carbon atoms, and R[16] is hydrogen or an alkyl, hydroxyalkyl, alkoxy or alkoxyalkyl group of 1 to 20 carbon atoms, which may be straight, branched or cyclic;

(B) an organic solvent; and (C) a photoacid generator.

30. A polymer comprising recurring units of an acrylic derivative of fluorinated backbone represented by the following general formula (1):

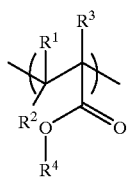
(1)

wherein

R$^1$, R$^2$ and R$^3$ are independently hydrogen, fluorine or unsubstituted or fluorinated, straight, branched or cyclic alkyl groups of 1 to 20 carbon atoms, at least one of R$^1$ and R$^2$ contains fluorine, and R$^4$ an acid labile group wherein said polymer further comprises one or more units selected from formulas (5-1) through (5-41):

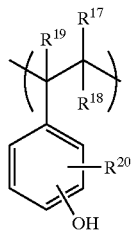
(5-1)

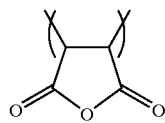
(5-2)

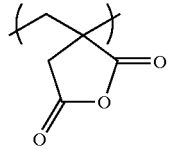
(5-3)

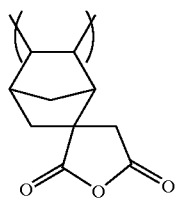
(5-4)

-continued

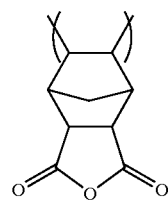
(5-5)

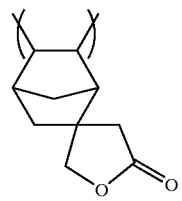
(5-6)

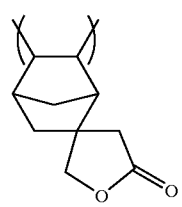
(5-7)

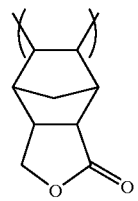
(5-8)

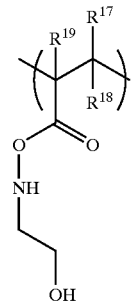
(5-9)

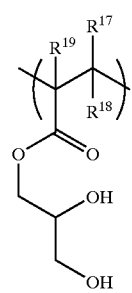
(5-10)

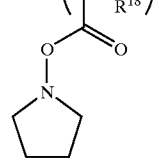
(5-11)

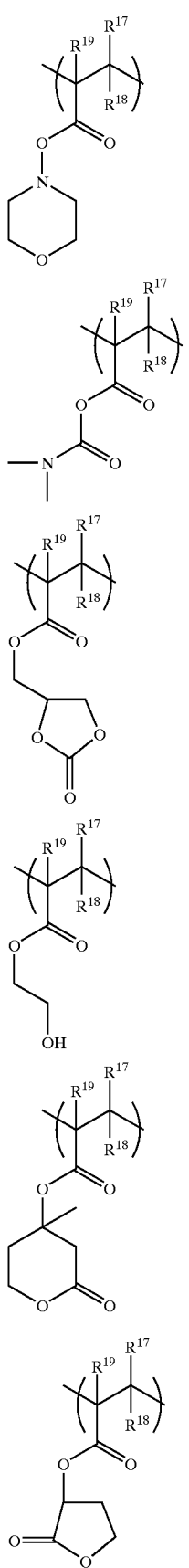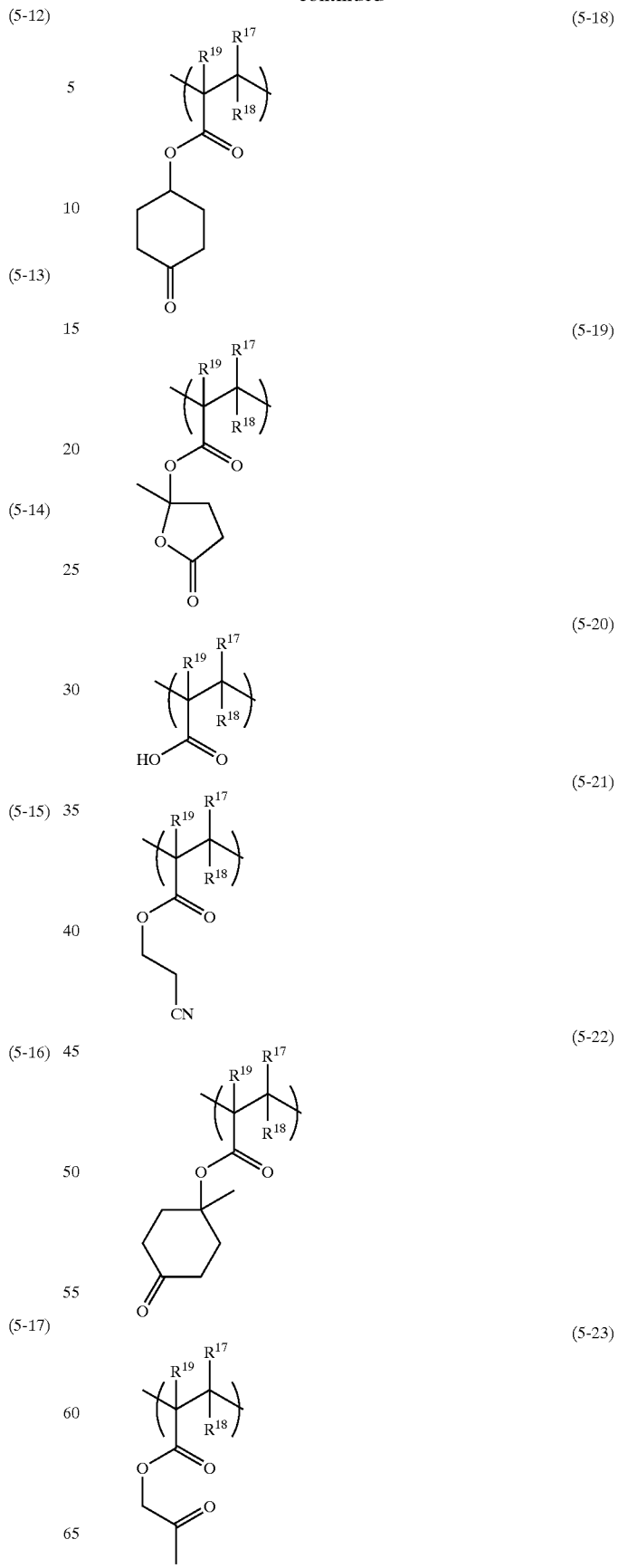

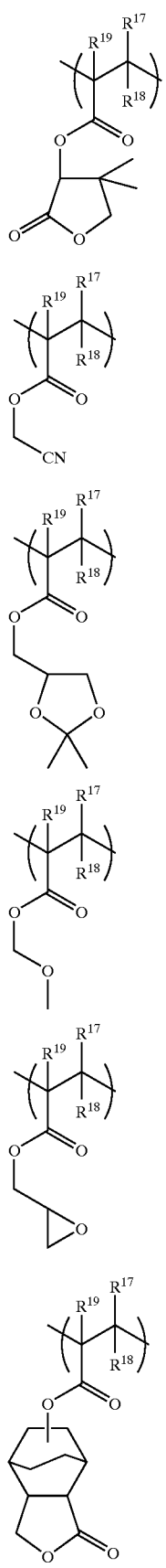
(5-24)
(5-25)
(5-26)
(5-27)
(5-28)
(5-29)
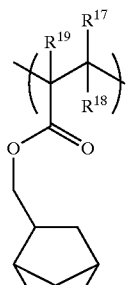 (5-30)
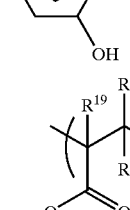 (5-31)
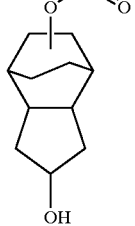 (5-32)
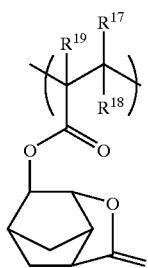 (5-33)
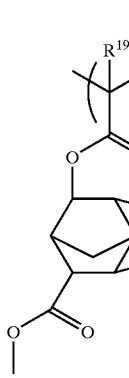 (5-34)

wherein $R^{17}$, $R^{18}$, $R^{19}$ and $R^{20}$ are each independently hydrogen, or a straight, branched or cyclic alkyl group of 1 to 20 carbon atoms.